United States Patent
Huang et al.

(10) Patent No.: US 10,276,677 B2
(45) Date of Patent: Apr. 30, 2019

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Shih-Wen Huang, Tainan (TW); Yun-Wen Chu, Kaohsiung (TW); Hong-Hsien Ke, Changhua County (TW); Chia-Hui Lin, Taichung (TW); Shin-Yeu Tsai, Zhubei (TW); Shih-Chieh Chang, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/494,023

(22) Filed: Apr. 21, 2017

(65) Prior Publication Data

US 2018/0151680 A1 May 31, 2018

Related U.S. Application Data

(60) Provisional application No. 62/427,063, filed on Nov. 28, 2016.

(51) Int. Cl.
*H01L 29/423* (2006.01)
*H01L 21/02* (2006.01)
(Continued)

(52) U.S. Cl.
CPC ...... *H01L 29/4232* (2013.01); *H01L 21/0217* (2013.01); *H01L 21/0228* (2013.01);
(Continued)

(58) Field of Classification Search
CPC . H01L 29/4232; H01L 29/0649; H01L 29/78; H01L 21/02126; H01L 21/02167; H01L 21/0217; H01L 29/66545; H01L 21/31111; H01L 21/0228; H01L 21/02244; H01L 29/401; H01L 21/02274; H01L 21/02164
See application file for complete search history.

(56) References Cited

U.S. PATENT DOCUMENTS 5,561,075 A * 10/1996 Nakazawa ........ H01L 21/28079
257/72
8,836,016 B2 9/2014 Wu et al.
(Continued)

*Primary Examiner* — Charles D Garber
*Assistant Examiner* — S M Sohel Imtiaz
(74) *Attorney, Agent, or Firm* — Birch, Stewart, Kolasch & Birch, LLP

(57) ABSTRACT

Semiconductor device structures and methods for forming the same are provided. A method for forming a semiconductor device structure includes forming a gate structure over a semiconductor substrate. The method also includes forming spacer elements adjoining sidewalls of the gate structure. The method further includes forming a protection material layer over the gate structure. The formation of the protection material layer includes a substantial non-plasma process. In addition, the method includes depositing a dielectric material layer over the protection material layer. The deposition of the dielectric material layer includes a plasma-involved process.

20 Claims, 23 Drawing Sheets

(51) Int. Cl.
*H01L 21/311* (2006.01)
*H01L 29/06* (2006.01)
*H01L 29/40* (2006.01)
*H01L 29/66* (2006.01)
*H01L 29/78* (2006.01)

(52) U.S. Cl.
CPC .. *H01L 21/02126* (2013.01); *H01L 21/02164* (2013.01); *H01L 21/02167* (2013.01); *H01L 21/31111* (2013.01); *H01L 29/0649* (2013.01); *H01L 29/401* (2013.01); *H01L 29/66545* (2013.01); *H01L 29/78* (2013.01); H01L 21/022 (2013.01); H01L 21/02244 (2013.01); H01L 21/02274 (2013.01)

(56) References Cited

U.S. PATENT DOCUMENTS

| | | |
|---|---|---|
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 2012/0091522 A1* | 4/2012 | Ozaki ................ H01L 23/291 257/330 |
| 2012/0164846 A1* | 6/2012 | Ha .................. H01L 21/02153 438/786 |
| 2014/0273386 A1* | 9/2014 | Tsao .................. H01L 29/665 438/301 |
| 2014/0312433 A1* | 10/2014 | He ...................... H01L 29/78 257/410 |
| 2015/0221749 A1* | 8/2015 | Xie ................ H01L 29/66545 257/410 |
| 2015/0325690 A1* | 11/2015 | Liu .................... H01L 21/3105 257/288 |
| 2017/0062266 A1* | 3/2017 | Deng ............... H01L 21/76224 |
| 2017/0294359 A1* | 10/2017 | Cantoro ........... H01L 21/02167 |

* cited by examiner

US 10,276,677 B2

SEMICONDUCTOR DEVICE STRUCTURE AND METHOD FOR FORMING THE SAME

CROSS REFERENCE TO RELATED APPLICATIONS

This Application claims the benefit of U.S. Provisional Application No. 62/427,063, filed on Nov. 28, 2016, and entitled "Semiconductor device structure and method for forming the same", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor device structures at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
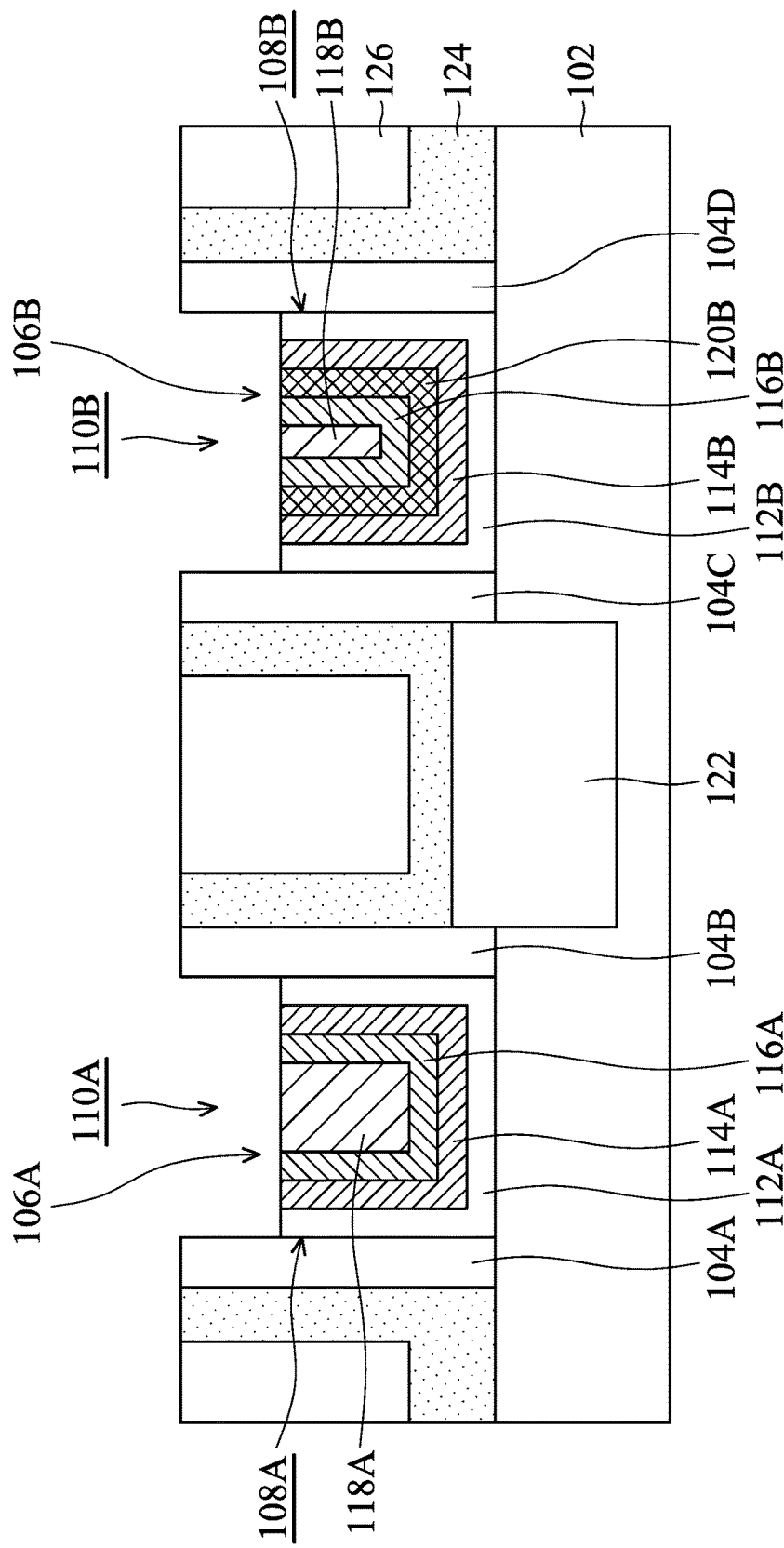
FIGS. 1A-1F are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Some embodiments of the disclosure are described. FIGS. 1A-1F are cross-sectional views of various stages of a process for forming a semiconductor device structure, in accordance with some embodiments. Additional operations can be provided before, during, and/or after the stages described in FIGS. 1A-1F. Some of the stages that are described can be replaced or eliminated for different embodiments. Additional features can be added to the semiconductor device structure. Some of the features described below can be replaced or eliminated for different embodiments.

As shown in FIG. 1A, a semiconductor substrate 102 is provided. In some embodiments, the semiconductor substrate 102 is a bulk semiconductor substrate, such as a semiconductor wafer. For example, the semiconductor substrate 102 is a silicon wafer. The semiconductor substrate 102 may include silicon or another elementary semiconductor material such as germanium. In some other embodiments, the semiconductor substrate 102 includes a compound semiconductor. The compound semiconductor may include gallium arsenide, silicon carbide, indium arsenide, indium phosphide, another suitable compound semiconductor, or a combination thereof.

In some embodiments, the semiconductor substrate 102 includes a semiconductor-on-insulator (SOI) semiconductor substrate. The SOI semiconductor substrate may be fabricated using a separation by implantation of oxygen (SIMOX) process, a wafer bonding process, another applicable method, or a combination thereof.

In some embodiments, the semiconductor substrate 102 includes various doping regions (not shown) according to design requirements of semiconductor elements. For example, the doping regions include p-type wells and/or n-type wells. In some embodiments, the doping regions are doped with p-type dopants. For example, the doping regions are doped with boron (B) or boron difluoride ($BF_2$). In some embodiments, the doping regions are doped with n-type dopants. For example, the doping regions are doped with phosphorus (P) or arsenic (As). In some embodiments, some doping regions are p-type doped regions and other doping regions are n-type doped regions.

In accordance with some embodiments, one or more fin structures (not shown) are formed over the semiconductor substrate 102. In some embodiments, multiple recesses (or trenches) are formed in the semiconductor substrate 102. As a result, multiple fin structures are formed between the recesses. In some embodiments, one or more photolithography and etching processes are used to partially remove the semiconductor substrate 102 and form the recesses.

As shown in FIG. 1A, spacer elements 104A, 104B, 104C and 104D are formed over the semiconductor substrate 102, in accordance with some embodiments. In some embodiments, the spacer elements 104A, 104B, 104C and 104D are formed over the fin structures of the semiconductor substrate 102.

In accordance with some embodiments, the spacer elements 104A, 104B, 104C and 104D are used to assist in the formation of source and drain structures in subsequent processes. In some embodiments, the spacer elements 104A, 104B, 104C and 104D are made of silicon nitride, silicon oxynitride, silicon carbide, another suitable material, or a combination thereof. In some embodiments, the spacer elements 104A, 104B, 104C and 104D are formed using a deposition process, such as a chemical vapor deposition (CVD) process, and an etching process.

As shown in FIG. 1A, gate structures 106A and 106B are formed over the semiconductor substrate 102, in accordance with some embodiments. In some embodiments, the gate structures 106A and 106B are formed over the fin structures of the semiconductor substrate 102.

As shown in FIG. 1A, two adjacent spacer elements 104A and 104B and the semiconductor substrate 102 together surround an opening 108A, in accordance with some embodiments. The gate structure 106A is formed in the opening 108A between the two adjacent spacer elements 104A and 104B. In other words, the spacer elements 104A and 104B are at opposite sides of the gate structure 106A, in accordance with some embodiments.

As shown in FIG. 1A, two adjacent spacer elements 104C and 104D and the semiconductor substrate 102 together surround an opening 108B, in accordance with some embodiments. The gate structure 106B is formed in the opening 108B between the two adjacent spacer elements 104C and 104D. In other words, the spacer elements 104C and 104D are at opposite sides of the gate structure 106B, in accordance with some embodiments.

Furthermore, as shown in FIG. 1A, the top surfaces of the spacer elements 104A, 104B, 104C and 104D are higher than the top surface of the gate structures 106A and 106B, in accordance with some embodiments. In some embodiments, the spacer elements 104A and 104B and the gate structure 106A together surround a recess 110A. In some embodiments, the spacer elements 104C and 104D and the gate structure 106B together surround a recess 110B.

As shown in FIG. 1A, the gate structure 106A includes a gate dielectric layer 112A, work function layers 114A and 116A, and a gate electrode layer 118A, in accordance with some embodiments. The gate dielectric layer 112A, the work function layer 114A, the work function layer 116A and the gate electrode layer 118A are sequentially positioned over the semiconductor substrate 102.

In some embodiments, the gate structure 106B includes a gate dielectric layer 112B, work function layers 114B, 116B and 120B, and a gate electrode layer 118B. The gate dielectric layer 112B, the work function layer 114B, the work function layer 120B, the work function layer 116B and the gate electrode layer 118B are sequentially positioned over the semiconductor substrate 102.

As shown in FIG. 1A, the gate dielectric layers 112A and 112B are substantially conformally deposited in the openings 108A and 108B, respectively, in accordance with some embodiments. In some embodiments, the gate dielectric layer 112A is over the semiconductor substrate 102 and partially covers the sidewalls of the spacer elements 104A and 104B. In some embodiments, the gate dielectric layer 112B is over the semiconductor substrate 102 and partially covers the sidewalls of the spacer elements 104C and 104D.

As shown in FIG. 1A, the work function layers 114A and 114B are substantially conformally deposited over the gate dielectric layers 112A and 112B, respectively, in accordance with some embodiments. In some embodiments, the work function layer 116A and the gate electrode layer 118A are sequentially deposited over the work function layer 114A. In some embodiments, the work function layer 116A and the gate electrode layer 118A are substantially conformally deposited.

In some embodiments, the work function layer 120B, the work function layer 116B and the gate electrode layer 118B are sequentially deposited over the work function layer 114B. In some embodiments, the work function layer 120B, the work function layer 116B and the gate electrode layer 118B are substantially conformally deposited.

In some embodiments, the gate dielectric layers 112A and 112B are made of silicon oxide, silicon nitride, silicon oxynitride, dielectric material with a high dielectric constant (high-K), another suitable dielectric material, or a combination thereof. Examples of high-K dielectric materials include hafnium oxide ($HfO_2$), zirconium oxide, aluminum oxide, hafnium dioxide-alumina alloy, hafnium silicon oxide, hafnium silicon oxynitride, hafnium tantalum oxide, titanium oxide, hafnium titanium oxide, hafnium zirconium oxide, another suitable high-K material, or a combination thereof. High-K dielectric materials may also include metal oxide, metal nitride, metal silicates, transition metal-oxide, transition metal-nitride, transition metal-silicates, metal oxynitride, metal aluminates, zirconium silicates, zirconium aluminates, $HfO_2$—$Al_2O_3$ alloy, another suitable material, or a combination thereof. In some embodiments, the gate dielectric layers 112A and 112B have substantially the same material.

In some embodiments, the work function layers 114A, 114B, 116A, 116B and 120B are used to provide the desired work function for transistors to enhance device performance including improved threshold voltage. In the embodiments of forming an NMOS transistor, the work function layers 114A, 114B, 116A, 116B and/or 120B can be an N-type metal layer. The N-type metal layer is capable of providing a work function value suitable for the device. The work function value may be substantially equal to or less than about 4.5 eV. The N-type metal layer may include metal, metal carbide, metal nitride, or a combination thereof. For example, the N-type metal layer includes tantalum, tantalum nitride, another suitable material, or a combination thereof.

On the other hand, in the embodiments of forming a PMOS transistor, the work function layers 114A, 114B, 116A, 116B and/or 120B can be a P-type metal layer. The P-type metal layer is capable of providing a work function value suitable for the device. The work function value may be substantially equal to or greater than about 4.8 eV. The P-type metal layer may include metal, metal carbide, metal nitride, other suitable materials, or a combination thereof. For example, the P-type metal includes titanium, titanium nitride, other suitable materials, or a combination thereof.

Many variations and/or modifications can be made to embodiments of the disclosure. In some other embodiments, the work function layers 114A, 114B, 116A, 116B and/or 120B includes hafnium, zirconium, titanium, tantalum, aluminum, a metal carbide (e.g., hafnium carbide, zirconium carbide, titanium carbide, aluminum carbide), aluminides, ruthenium, palladium, platinum, cobalt, nickel, and conductive metal oxides, or a combination thereof. The thickness and/or the components of the work function layers 114A, 114B, 116A, 116B and 120B may be adjusted to fine-tune the work function level thereof.

In some embodiments, the work function layers 114A and 116A of the gate structure 106A are made of different materials. In some embodiments, the work function layers 114B, 116B and 120B of the gate structure 106B are made of different materials.

In some embodiments, the work function layer 114A of the gate structure 106A and the work function layer 114B of the gate structure 106B are made of substantially the same material. In some embodiments, the work function layer 116A of the gate structure 106A and the work function layer 116B of the gate structure 106B are made of substantially the same material.

In some embodiments, the gate electrode layer 118A provides an electrical connection between the work function layer 116A and a subsequently formed contact that is coupled to the gate electrode layer 118A. In some embodiments, the gate electrode layer 118B provides an electrical connection between the work function layer 116B and a subsequently formed contact that is coupled to the gate electrode layer 118B. In some embodiments, the gate electrode layers 118A and 118B are made of a suitable metal material. The metal material may include aluminum, tungsten, copper, gold, platinum, cobalt, another suitable metal material, an alloy thereof, or a combination thereof.

In some embodiments, the gate structures 106A and 106B are formed by a gate replacement process. The gate replacement process may be performed after the formation of an etch stop layer 124 and a dielectric layer 126, which will be described in more detail later. In some embodiments, a dummy or sacrificial gate (not shown) between the spacer elements 104A and 104B are removed to form the opening 108A. In some embodiments, a dummy or sacrificial gate (not shown) between the spacer elements 104C and 104D are removed to form the opening 108B. In some embodiments, the dummy gate is made of a sacrificial material, for example, polysilicon.

In some embodiments, a gate dielectric material layer for forming the gate dielectric layers 112A and 112B is deposited over the spacer elements 104A, 104B, 104C and 104D. The gate dielectric material layer may be deposited in the openings 108A and 108B substantially conformally. In some embodiments, the gate dielectric material layer is deposited using an atomic layer deposition (ALD) process, a CVD process, a spin-on process, another applicable process, or a combination thereof. In some embodiments, a high-temperature annealing operation is performed to reduce or eliminate defects in the gate dielectric layers 112A and 112B.

Afterwards, a first work function material layer for forming the work function layers 114A and 114B is deposited over the gate dielectric material layer, in accordance with some embodiments. The first work function material layer may be deposited over the gate dielectric material layer in the openings 108A and 108B substantially conformally.

Subsequently, a patterned mask layer (not shown) is formed to cover and/or fill the opening 108A. It is ensured that a subsequently formed second work function material layer is deposited in the opening 108B without being deposited in the opening 108A. The mask layer is also referred to as a blocking layer. In some embodiments, the mask layer includes polysilicon, amorphous silicon, silicon nitride, silicon oxide, silicon oxynitride, silicon carbide, spin-on glass (SOG), another suitable material, or a combination thereof.

In some embodiments, a hard mask material for forming the mask layer is deposited. The hard mask material fills up the openings 108A and 108B and extends outside the openings 108A and 108B. Afterwards, a planarization process is performed to remove the hard mask material outside the openings 108A and 108B. The planarization process may include a chemical mechanical polishing (CMP) process, a grinding process, an etching process, another applicable process, or a combination thereof.

In some embodiments, a patterned mask element (not shown) is formed to cover the hard mask material remaining in the opening 108A. As a result, the hard mask material remaining in the opening 108B is exposed. In some embodiments, the patterned mask element is a patterned photoresist layer. Subsequently, the hard mask material remaining in the opening 108B is removed using a suitable etchant, in accordance with some embodiments. The patterned mask element is then removed. As a result, the hard mask material remaining in the opening 108A form the patterned mask layer covering and/or filling the opening 108A.

Afterwards, a second work function material layer for forming the work function layer 120B is substantially conformally deposited over the first work function material layer in the opening 108B, in accordance with some embodiments. Due to the patterned mask layer covering and/or filling the opening 108A, the second work function material layer is not deposited in the opening 108A. The patterned mask layer is then removed.

Afterwards, a third work function material layer for forming the work function layers 116A and 116B is deposited, in accordance with some embodiments. In some embodiments, the third work function material layer is substantially conformally deposited over the first work function material layer in the opening 108A and the second work function material layer in the opening 108B. Subsequently, a gate electrode material layer is substantially conformally deposited to fill up the openings 108A and 108B.

In some embodiments, the first, second and third work function material layers and the gate electrode material layer are deposited using suitable deposition processes. The deposition processes may include an ALD process, a physical vapor deposition (PVD) process, an electroplating process, an electroless plating process, a CVD process, another applicable process, or a combination thereof.

In some embodiments, a planarization process is performed to remove the gate dielectric material layer, the first, second and third work function material layers and the gate electrode material layer outside the openings 108A and 108B. The planarization process may include a CMP process, a grinding process, an etching process, another applicable process, or a combination thereof.

Afterwards, the gate dielectric material layer, the first and second work function material layers and the gate electrode material layer in the opening 108A are partially removed, in accordance with some embodiments. As a result, the gate structure 106A and the recess 110A are formed in the opening 108A. In some embodiments, the gate dielectric material layer, the first, second and third work function material layers and the gate electrode material layer in the opening 108B are partially removed. As a result, the gate structure 106B and the recess 110B are formed in the opening 108B.

In some embodiments, the gate dielectric material layer, the first and second work function material layers and the gate electrode material layer in the openings 108A and 108B are partially removed using etching processes or other applicable processes.

In accordance with some embodiments, the gate dielectric material layer remaining in the opening 108A forms the gate dielectric layer 112A. The first and second work function material layers remaining in the opening 108A respectively form the work function layers 114A and 116A. The gate electrode material layer remaining in the opening 108A forms the gate electrode layer 118A.

In accordance with some embodiments, the gate dielectric material layer remaining in the opening 108B forms the gate dielectric layer 112B. The first, second and third work function material layers remaining in the opening 108B respectively form the work function layers 114B, 120B and 116B. The gate electrode material layer remaining in the opening 108B forms the gate electrode layer 118B.

It should be noted that the formation method of the gate structures 106A and 106B is not limited. The gate structures 106A and 106B may be formed by another applicable fabrication process.

As shown in FIG. 1A, a source or drain structure 122 is over the semiconductor substrate 102 between the gate structures 106A and 106B, in accordance with some embodiments. In some embodiments, the source or drain structure 122 is over the semiconductor substrate 102 between the spacer elements 104B and 104C.

In some embodiments, the source or drain structure 122 is used as a strained structure. The source or drain structure 122 provides the channel region under the gate structures 106A and 106B with strain or stress. Therefore, the carrier mobility of the device is increased and device performance is enhanced.

In some embodiments, the source or drain structure 122 includes an N-type semiconductor material. In some embodiments, the source or drain structure 122 includes an epitaxially grown material, such as silicon, silicon phosphide (SiP), and/or another suitable semiconductor material.

Embodiments of the disclosure have many variations. In some embodiments, the source or drain structure 122 includes a P-type semiconductor material. In some embodiments, the source or drain structure 122 includes an epitaxially grown material, such as silicon germanium (SiGe) and/or another suitable semiconductor material.

In some embodiments, the semiconductor substrate 102 between the spacer elements 104B and 104C is etched to form a recess. Afterwards, a semiconductor material is epitaxially grown in the recess and is growing continually to form the source or drain structure 122.

In some embodiments, the source or drain structure 122 is formed using a selective epitaxy growth (SEG) process, a CVD process (e.g., a vapor-phase epitaxy (VPE) process, a low pressure CVD (LPCVD) process, and/or an ultra-high vacuum CVD (UHV-CVD) process), a molecular beam epitaxy process, deposition of doped amorphous semiconductor (e.g. Si, Ge or SiGe) followed by a solid-phase epitaxial recrystallization (SPER) step, another applicable process, or a combination thereof. The formation process of the source or drain structure 122 may use gaseous and/or liquid precursors that can react with components of the semiconductor substrate 102 below the source or drain structure 122.

In some embodiments, the source or drain structure 122 is doped with one or more suitable dopants. For example, the source or drain structure 122 is a Si source or drain feature doped with phosphorus (P), arsenic (As), antimony (Sb), or another suitable dopant. Alternatively, the source or drain structure 122 is a SiGe source or drain feature doped with boron (B) or another suitable dopant.

In some embodiments, the source or drain structure 122 is doped in-situ during the growth of the source or drain structure 122. In some other embodiments, the source or drain structure 122 is not doped during the growth of the source or drain structure 122. After the epitaxial growth, the source or drain structure 122 is doped in a subsequent process. In some embodiments, the doping is achieved using an ion implantation process, a plasma immersion ion implantation process, a gas and/or solid source diffusion process, another applicable process, or a combination thereof. In some embodiments, the source or drain structure 122 is further exposed to annealing processes to activate the dopants. For example, a rapid thermal annealing process is performed.

As shown in FIG. 1A, the etch stop layer 124 is formed over the sidewalls of the spacer elements 104A, 104B, 104C and 104D, the semiconductor substrate 102 and the source or drain structure 122, in accordance with some embodiments. In some embodiments, the etch stop layer 124 includes silicon nitride, silicon oxynitride, silicon oxycarbide, silicon carbide, another suitable material, or a combination thereof.

As shown in FIG. 1A, the dielectric layer 126 is formed over the etch stop layer 124, in accordance with some embodiments. In some embodiments, the dielectric layer 126 includes silicon oxide, silicon nitride, silicon oxynitride, another suitable material, or a combination thereof.

In some embodiments, an etch stop material layer and a dielectric material layer are sequentially deposited over the semiconductor substrate 102, the spacer elements 104A, 104B, 104C and 104D, and the source or drain structure 122. In some embodiments, the etch stop material layer and the dielectric material layer are deposited using a CVD process, a spin-on process, another applicable process, or a combination thereof.

In some embodiments, a planarization process is subsequently performed to partially remove the etch stop material layer and the dielectric material layer. In some embodiments, the etch stop material layer and the dielectric material layer are partially removed until the spacer elements 104A, 104B, 104C and 104D are exposed. As a result, the remaining portion of the etch stop material layer forms the etch stop layer 124. The remaining portion of the dielectric material layer forms the dielectric layer 126. The planarization process may include a CMP process, a grinding process, an etching process, another applicable process, or a combination thereof. However, embodiments of the disclosure are not limited thereto. In some other embodiments, the etch stop layer 124 is not formed.

As mentioned above, in some embodiments, the gate replacement process is performed after the formation of the etch stop layer 124 and the dielectric layer 126. As a result, the gate structures 106A and 106B are formed.

Figure 1B:
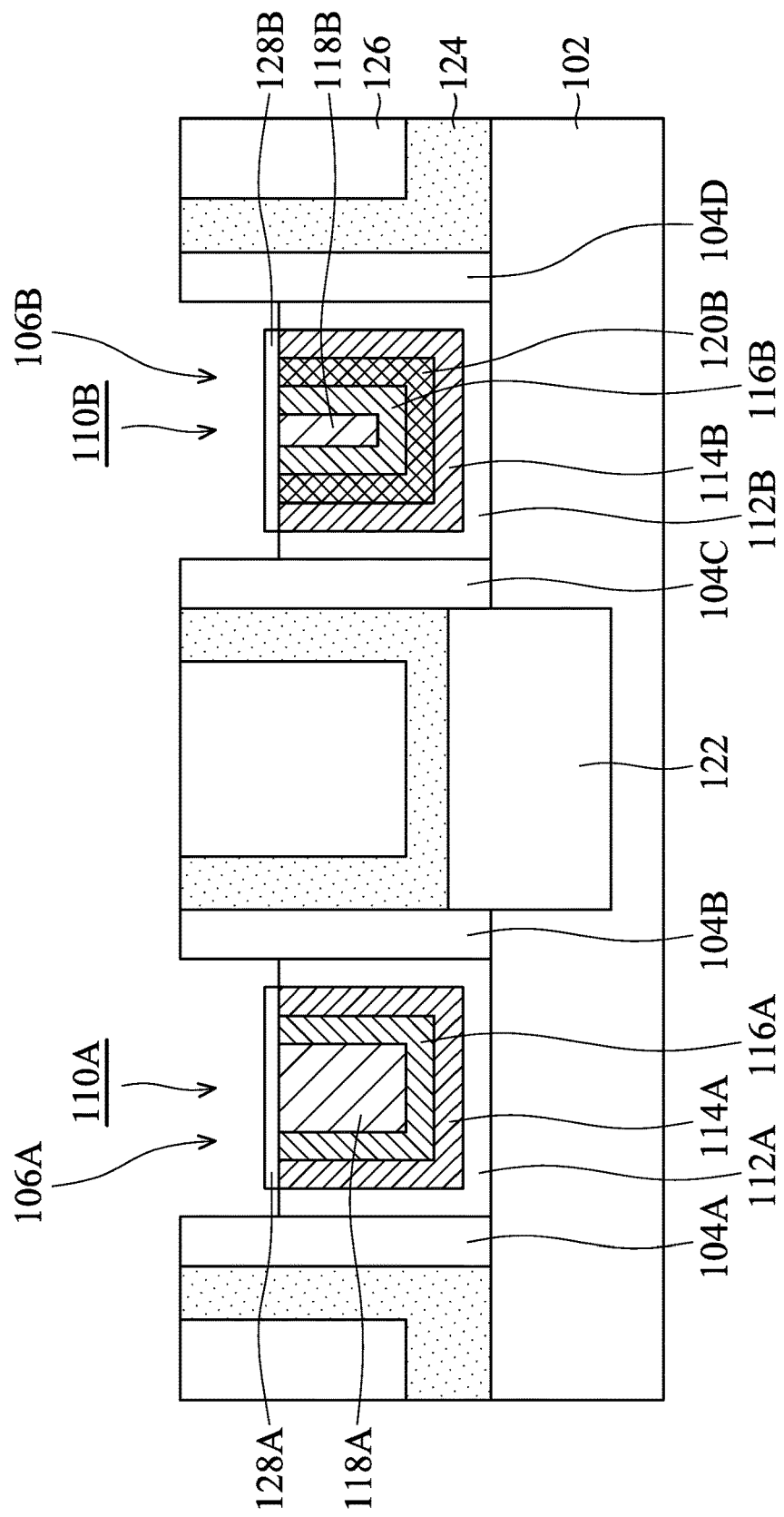

As shown in FIG. 1B, protection layers 128A and 128B are formed in the recesses 110A and 110B, respectively, in accordance with some embodiments. In some embodiments, the protection layer 128A is over the gate structure 106A and covers the work function layers 114A and 116A and the gate electrode layer 118A. In some embodiments, the protection layer 128B is over the gate structure 106B and covers the work function layers 114B, 116B and 120B and the gate electrode layer 118B. In some embodiments, the protection layers 128A and 128B are also referred to as a protection material layer.

In accordance with some embodiments, the formation of the protection layers 128A and 128B includes a non-plasma process or a substantial plasma-free process. In some embodiments, the protection layers 128A and 128B, which are formed using a non-plasma process, cover the work function layers and the gate electrode layer of the gate structures 106A and 106B. The work function layers and the gate electrode layer of the gate structures 106A and 106B are prevented from being in direct contact with plasma during subsequent processes. The subsequent processes may include one or more plasma-involved processes. As a result, current leakage via the gate structures 106A and 106B, which may be the result of plasma-induced damage to the gate structures 106A and 106B, is reduced or eliminated. Accordingly, the breakdown voltage of the semiconductor device structure is improved in some embodiments. Therefore, the reliability and stability of the semiconductor device structure is significantly enhanced.

In some embodiments, the protection layers 128A and 128B include a metal oxide material. In some embodiments, each of the protection layers 128A and 128B includes aluminum oxide, tungsten oxide, copper oxide, gold oxide, platinum oxide, cobalt oxide, titanium oxide, tantalum oxide, hafnium oxide, zirconium oxide, ruthenium oxide, palladium oxide, nickel oxide, another suitable metal oxide material, or a combination thereof.

In some embodiments, the protection layers 128A and 128B are made of substantially the same material. However, embodiments of the disclosure are not limited thereto. In some other embodiments, the protection layers 128A and 128B are made of different materials.

In accordance with some embodiments, the protection layers 128A and 128B are formed by oxidizing the surface portion or top portion of the gate structures 106A and 106B, respectively. In some embodiments, the structure shown in FIG. 1A is transferred in a reaction chamber. A reactant is fed in the reaction chamber and the structure shown in FIG. 1A is heated. As a result, the surface portion of the gate structures 106A and 106B is oxidized. In some embodiments, the reactant is an oxygen-containing gas, such as oxygen gas ($O_2$), another suitable reactant, or a combination thereof.

In some embodiments, the oxidation of the surface portion of the gate structures 106A and 106B is performed at a temperature that is in a range from about 300 degrees C. to about 700 degrees C. In some embodiments, the temperature is in a range from about 400 degrees C. to about 600 degrees C. In some cases, the temperature should be substantially equal to or greater than about 300 degrees C. If the temperature is less than about 300 degrees C., the surface portion of the gate structures 106A and 106B is insufficiently oxidized. As a result, the protection layers 128A and 128B are not formed or they have a deficient thickness. The protection of the gate structures 106A and 106B from plasma may be insufficient. However, embodiments of the disclosure are not limited thereto. In some other cases, the temperature may be less than about 300 degrees C.

In some cases, the temperature should be substantially equal to or less than about 700 degrees C. If the temperature is greater than about 700 degrees C., the device may be negatively affected. However, embodiments of the disclosure are not limited thereto. In some other cases, the temperature may be greater than about 700 degrees C.

As shown in FIG. 1B, the surface portion or top portion of the work function layers 114A and 116A and the gate electrode layer 118A are oxidized, in accordance with some embodiments. As a result, the protection layer 128A is formed. In some embodiments, the surface portion or top portion of the work function layers 114B, 116B and 120B and the gate electrode layer 118B are oxidized. As a result, the protection layer 128B is formed.

As shown in FIG. 1B, the protection layer 128A does not directly adjoin the sidewalls of the spacer elements 104A and 104B, in accordance with some embodiments. In some embodiments, the protection layer 128B does not directly adjoin the sidewalls of the spacer elements 104C and 104D.

In accordance with some embodiments, the protection layers 128A and 128B have a thickness that is in a range from about 5 angstrom (Å) to about 30 Å. In some embodiments, the thickness of the protection layers 128A and 128B is in a range from about 10 Å to about 20 Å. In some cases, the thickness of the protection layers 128A and 128B should be substantially equal to or greater than about 5 Å. If the thickness of the protection layers 128A and 128B is less than about 5 Å, the protection layers 128A and 128B may not provide the gate structures 106A and 106B with enough protection from plasma. However, embodiments of the disclosure are not limited thereto. In some other cases, the thickness of the protection layers 128A and 128B may be less than about 5 Å.

In some cases, the thickness of the protection layers 128A and 128B should be substantially equal to or less than about 30 Å. If the thickness of the protection layers 128A and 128B is greater than about 30 Å, the fabrication cost of the formation of the protection layers 128A and 128B is undesirably increased. However, embodiments of the disclosure are not limited thereto. In some other cases, the thickness of the protection layers 128A and 128B may be greater than about 30 Å.

Figure 1C:
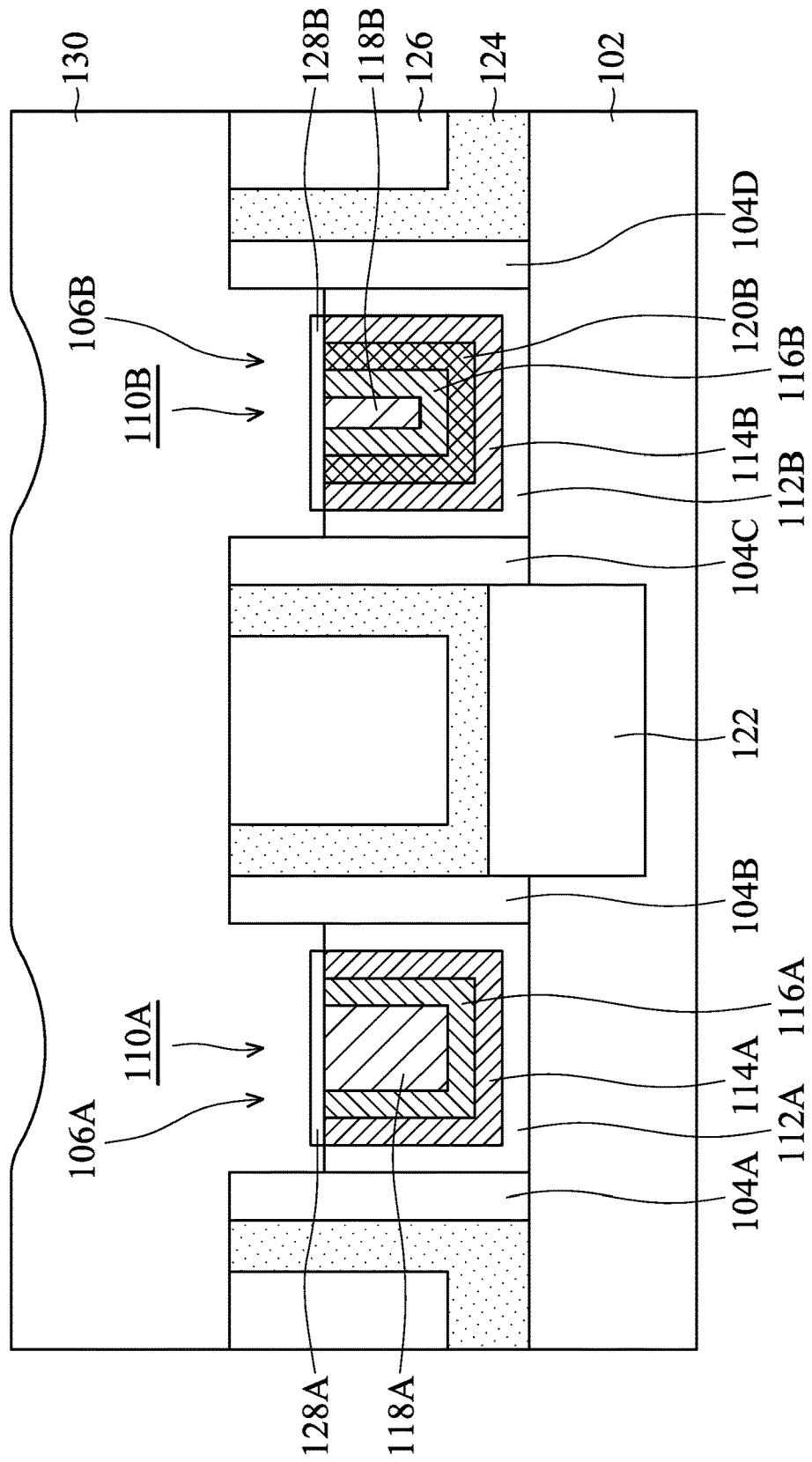

As shown in FIG. 1C, a protection material layer 130 is deposited, in accordance with some embodiments. The protection material layer 130 is over the protection layers 128A and 128B, the spacer elements 104A, 104B, 104C and 104D, the etch stop layer 124 and the dielectric layer 126. In some embodiments, the protection material layer 130 fills up the recesses 110A and 110B, as shown in FIG. 1C.

In some embodiments, the protection material layer 130 includes a dielectric material. In some embodiments, the dielectric material includes silicon oxide, silicon oxycarbide, silicon nitride, nitrogen silicon carbide, another suitable material, or a combination thereof. In some embodiments, the protection material layer 130 is deposited using a plasma-involved deposition process, another applicable process, or a combination thereof. For example, the plasma-involved deposition process may be a plasma-enhanced CVD (PECVD) process or another applicable process. The deposition of the protection material layer 130 may be a self-alignment contact (SAC) process.

Figure 1D:
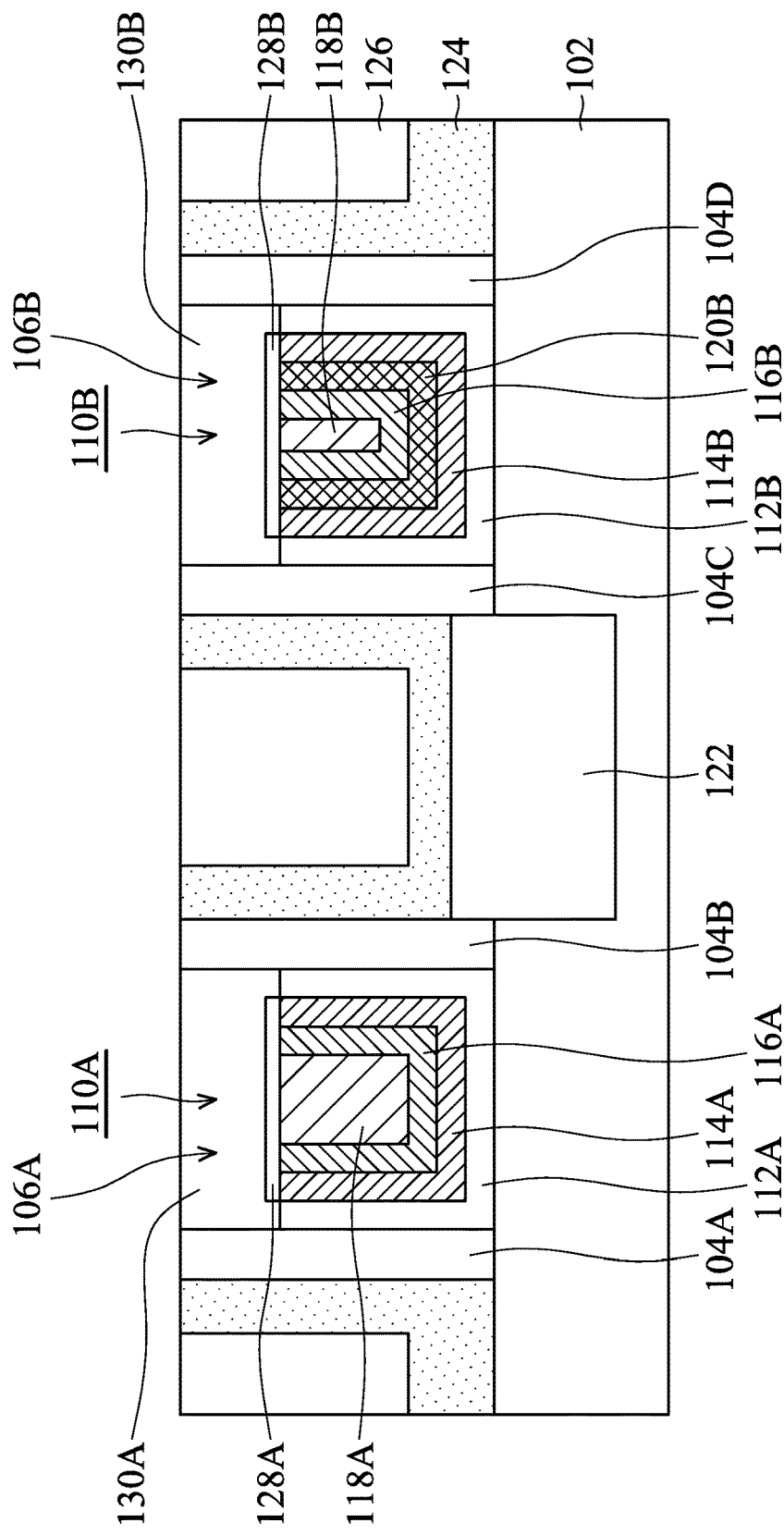

As shown in FIG. 1D, the protection material layer 130 outside the recesses 110A and 110B is removed, in accordance with some embodiments. In some embodiments, the protection material layer 130 is partially removed until the spacer elements 104A, 104B, 104C and 104D, the etch stop layer 124 and the dielectric layer 126 are exposed. In some embodiments, a planarization process is performed to remove the protection material layer 130 outside the recesses 110A and 110B. The planarization process may include a CMP process, a grinding process, an etching process, another applicable process, or a combination thereof.

In some embodiments, the remaining portions of the protection material layer 130 in the recesses 110A and 110B respectively form protection layers 130A and 130B. In some embodiments, the protection layer 130A is over the protection layer 128A in the recess 110A. In some embodiments, the protection layer 130A is in direct contact with the sidewalls of the spacer elements 104A and 104B. In some embodiments, the protection layer 130B is over the protection layer 128B in the recess 110B. In some embodiments, the protection layer 130B is in direct contact with the sidewalls of the spacer elements 104C and 104D.

In some embodiments, a contact plug, which is electrically connected to the source or drain structure 122, will be formed in a subsequent process. In some cases, the position shift in the subsequently formed contact plug may arise due to process variation. In accordance with some embodiments, the protection layer 130A, which covers the gate structure 106A, prevents the gate structure 106A from being electrically connected to the shifted contact plug. In some embodiments, the protection layer 130B, which covers the gate structure 106B, prevents the gate structure 106B from being electrically connected to the shifted contact plug.

In some embodiments, as mentioned above, the work function layers 114A and 116A and the gate electrode layer 118A of the gate structure 106A are covered by the protection layer 128A. The work function layers 114B, 116B and 120B and the gate electrode layer 118B are covered by the protection layer 128B. As a result, the work function layers 114A, 114B, 116A, 116B and 120B and the gate electrode layers 118A and 118B are isolated from plasma during the plasma deposition process of the protection material layer 130.

In accordance with some embodiments, the work function layers 114A, 114B, 116A, 116B and 120B and the gate electrode layers 118A and 118B are not in direct contact with plasma during the formation of the protection layers 128A, 128B, 130A and 130B. Current leakage through the gate structures 106A and 106B is reduced or eliminated. Accordingly, the breakdown voltage of the semiconductor device structure is improved, and the reliability of the device is enhanced.

Figure 1E:
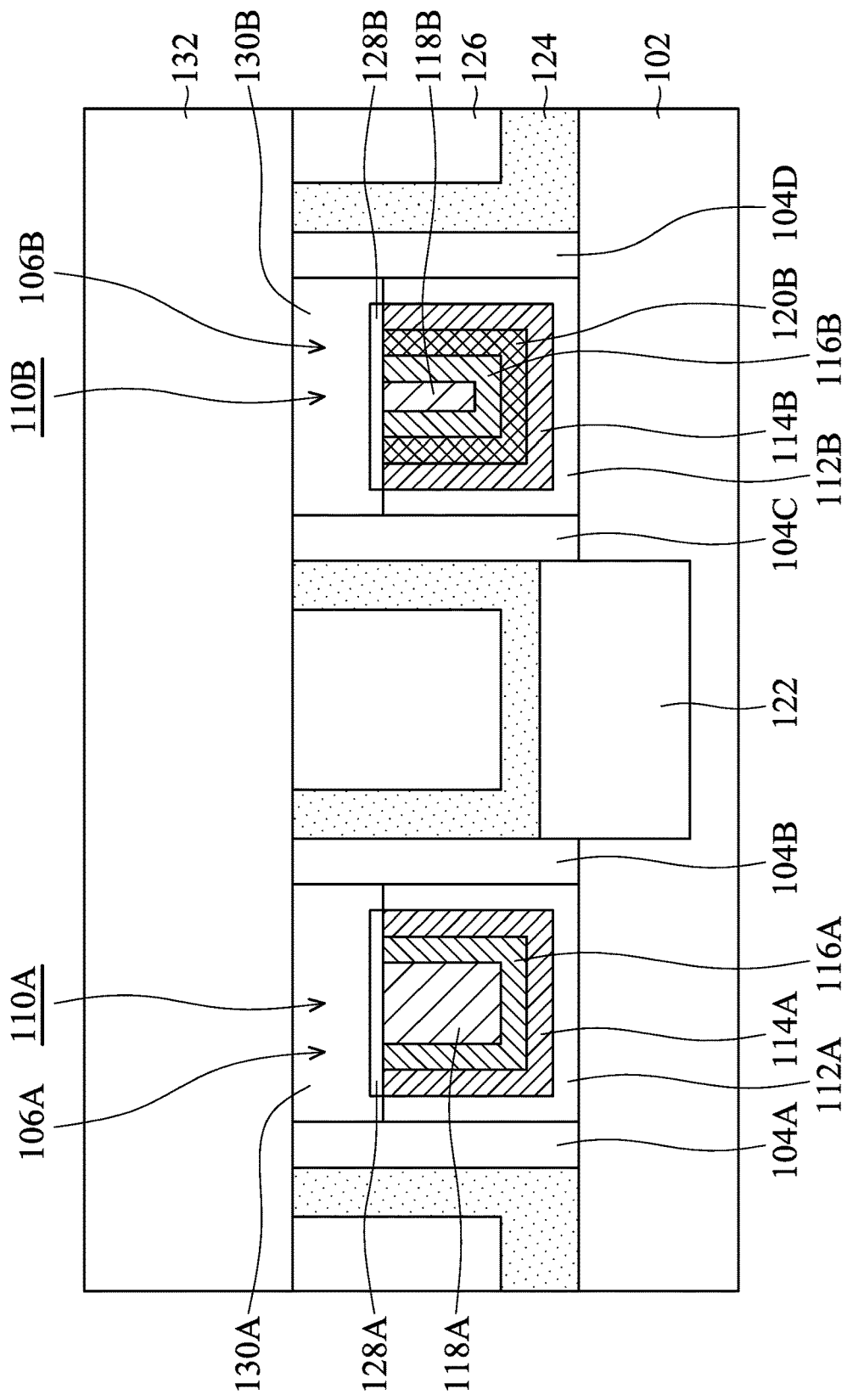

As shown in FIG. 1E, an inter-layer dielectric (ILD) layer 132 is deposited, in accordance with some embodiments. The ILD layer 132 is over the spacer elements 104A, 104B, 104C and 104D, the etch stop layer 124, the dielectric layer 126 and the protection layers 130A and 130B. In some embodiments, the ILD layer 132 is made of silicon oxide, silicon nitride, silicon oxynitride, borosilicate glass (BSG), phosphoric silicate glass (PSG), borophosphosilicate glass (BPSG), fluorinated silicate glass (FSG), SOG, high density plasma (HDP) deposition dielectric material, low-k material, another suitable material, or a combination thereof. In some embodiments, the ILD layer 132 is deposited using a CVD process, a spin-on process, an HDPCVD process, another applicable process, or a combination thereof.

Figure 1F:
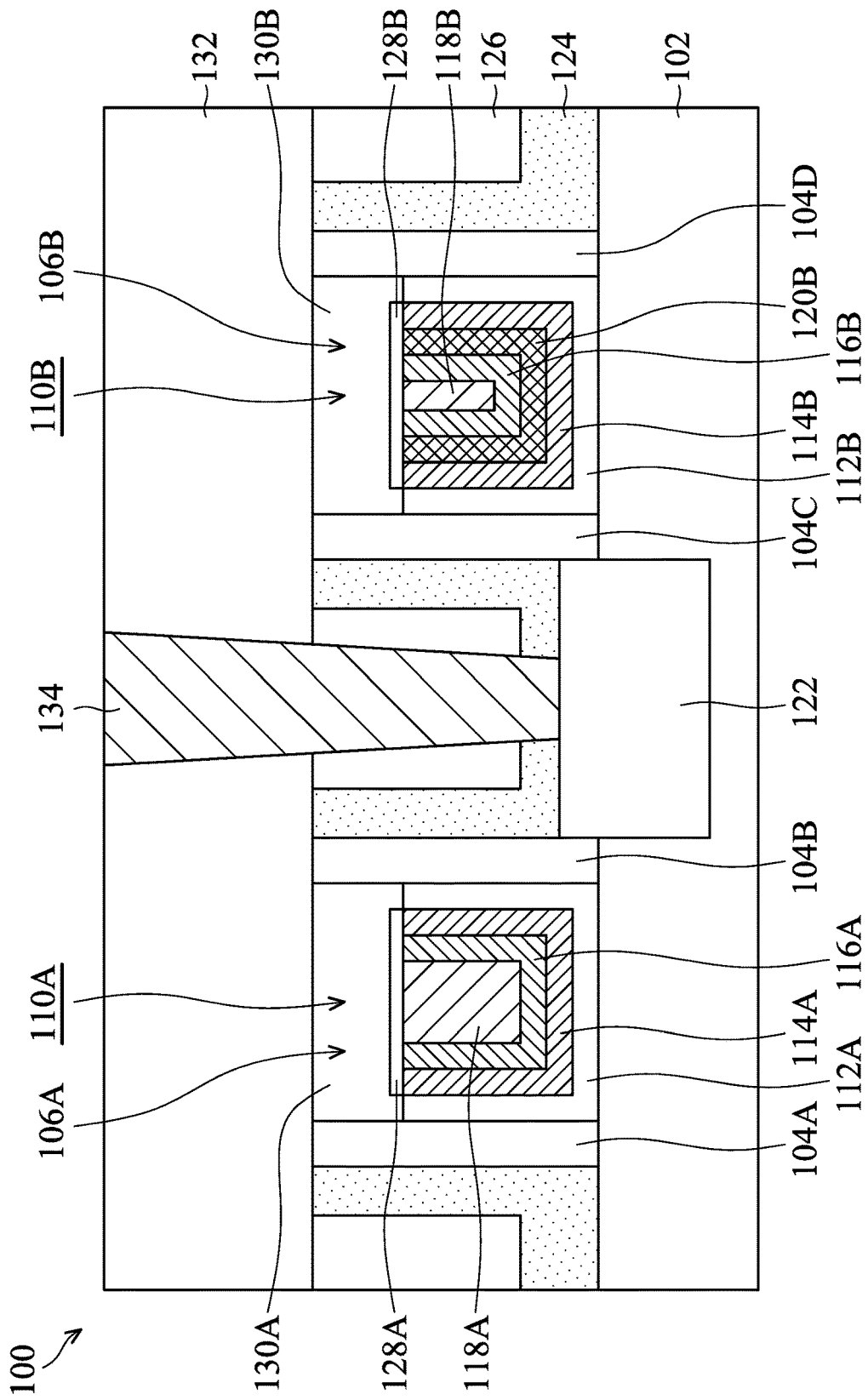

As shown in FIG. 1F, a contact plug 134 is formed in the ILD layer 132, in accordance with some embodiments. As a result, a semiconductor device structure 100 is formed. The contact plug 134 provides an electrical connection between the source or drain structure 122 and a subsequently formed multi-layer interconnection (MLI). In some embodiments, the contact plug 134 includes aluminum, tungsten, copper, gold, platinum, cobalt, another suitable metal material, an alloy thereof, or a combination thereof. In some embodiments, the ILD layer 132, the etch stop layer 124 and the dielectric layer 126 are etched to form an opening. Afterwards, a conductive material fills the opening to form the contact plug 134.

It should be noted that the embodiments shown in FIGS. 1A-1F are merely examples, and embodiments of the disclosure are not limited thereto. Many variations and/or modifications can be made to embodiments of the disclosure. In some other embodiments, a semiconductor device structure has a protection layer having an arrangement different than that of the protection layers 128A and 128B. Examples of the protection layer are shown in FIGS. 2A-2E, 3A-3F, 4A, 4B, and 5A-5D, which will be described in more detail later.

It should be noted that the same reference numeral in FIGS. 1A-1F, 2A-2E, 3A-3F, 4A, 4B, and 5A-5D is designated the same feature or similar features, for example, the protection material layer 130, the ILD layer 132 and the contact plug 134. The material and formation method of the same feature or similar features are as described in the embodiments of FIGS. 1A-1F, and are not repeated hereafter for the purpose of simplicity.

Figure 2A:
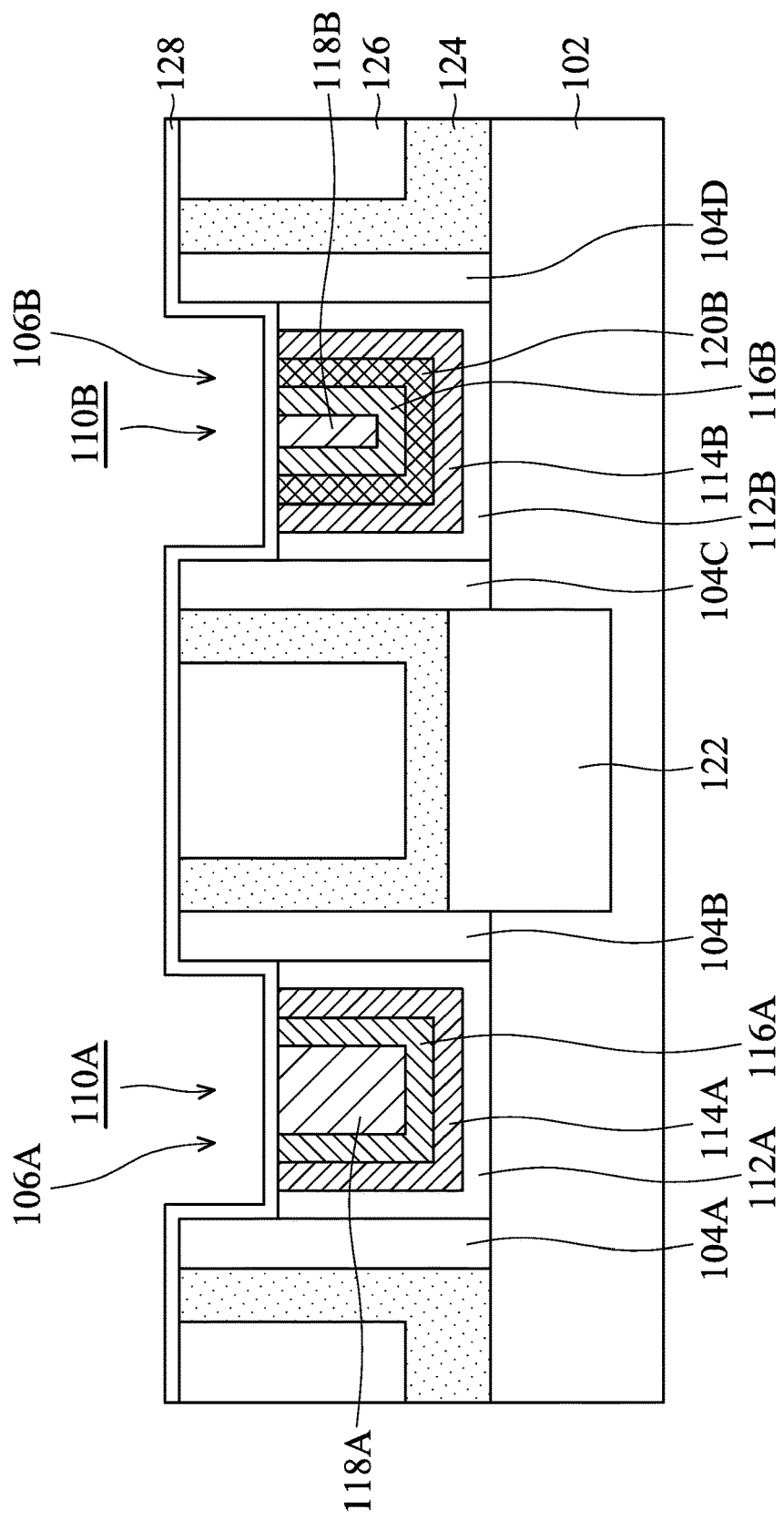
FIGS. 2A-2E are cross-sectional views of various stages of a process for forming a semiconductor device structure, in accordance with some embodiments.

FIGS. 2A-2E are cross-sectional views of various stages of a process for forming a semiconductor device structure, in accordance with some embodiments. As shown in FIG. 2A, a protection material layer 128 is deposited over the spacer elements 104A, 104B, 104C and 104D, the etch stop layer 124 and the dielectric layer 126, in accordance with some embodiments. In some embodiments, the protection material layer 128 is further deposited over the top surface of the gate structure 106A in the recess 110A and the sidewalls of the spacer elements 104A and 104B in the recess 110A. In some embodiments, the protection material layer 128 is further deposited over the top surface of the gate structure 106B in the recess 110B and the sidewalls of the spacer elements 104C and 104D in the recess 110B. In some embodiments, the protection material layer 128 is deposited substantially conformally.

In some embodiments, the protection material layer 128 includes a dielectric material. In some embodiments, the dielectric material includes silicon oxide, silicon oxycarbide, silicon nitride, nitrogen silicon carbide, another suitable material, or a combination thereof.

In some embodiments, the protection material layer 128 is deposited using a substantial non-plasma deposition process. For example, the substantial non-plasma deposition process may be a non-plasma CVD process, a non-plasma ALD process, a non-plasma thermal deposition process, another applicable process, or a combination thereof.

In some embodiments, the substantial non-plasma CVD process includes a low pressure CVD (LPCVD) process, a low temperature CVD (LTCVD) process, a rapid thermal CVD (RTCVD) process, another applicable process, or a combination thereof. In some embodiments, the substantial non-plasma thermal deposition process includes introducing a gaseous precursor for forming the protection material layer 128 to the structure shown in FIG. 1A. Afterwards, the gaseous precursor reacts by performing a thermal treatment. As a result, as shown in FIG. 2A, the protection material layer 128 is deposited over the structure shown in FIG. 1A.

Figure 2B:
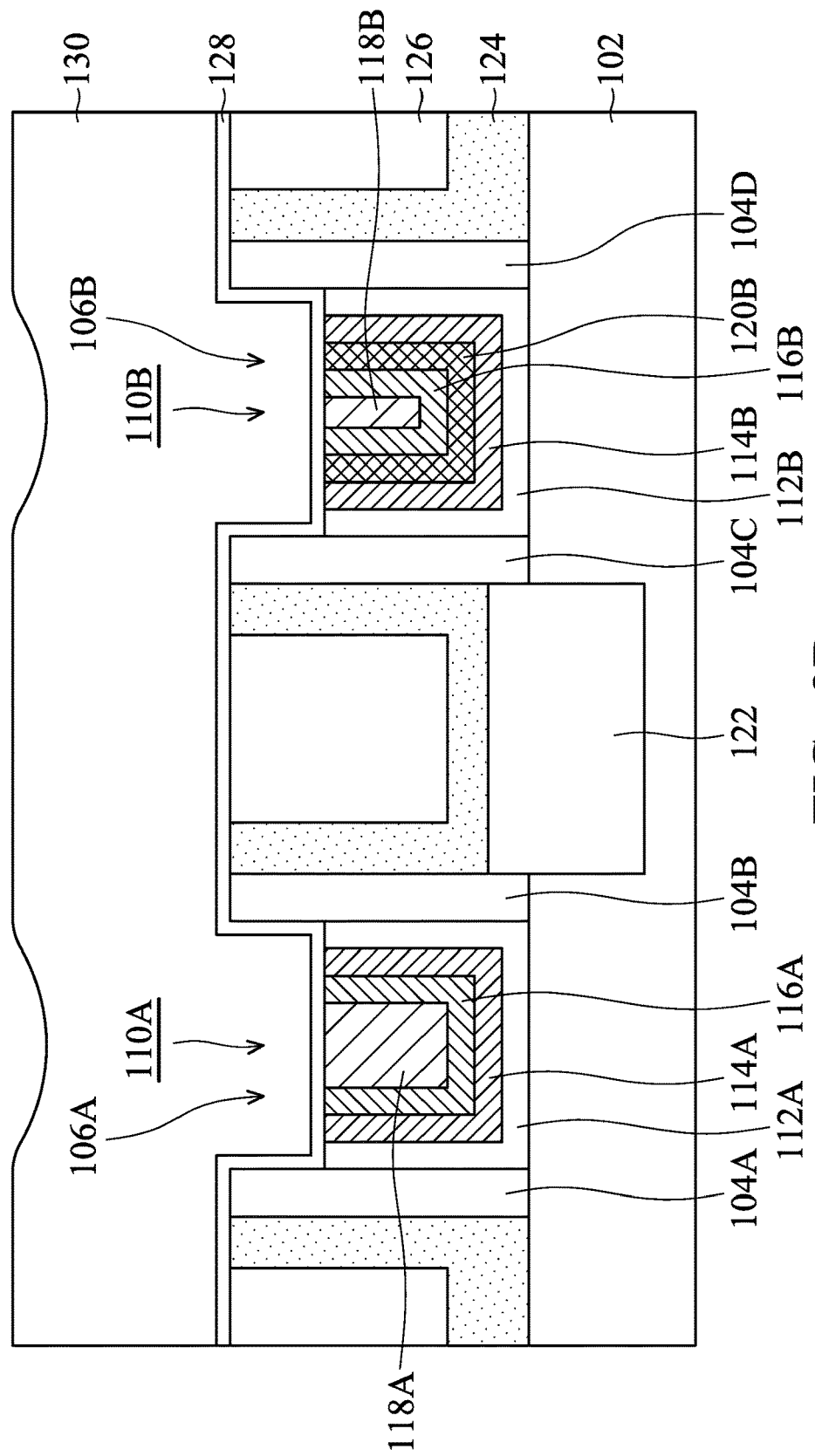

As shown in FIG. 2B, a protection material layer 130 is deposited over the protection material layer 128, in accordance with some embodiments. In some embodiments, the protection material layer 130 fills up the recesses 110A and 110B.

In some embodiments, the protection material layer 130 includes a dielectric material. In some embodiments, the dielectric material includes silicon oxide, silicon oxycarbide, silicon nitride, nitrogen silicon carbide, another suitable material, or a combination thereof. In some embodiments, the protection material layer 130 is deposited using a plasma-involved deposition process, another applicable process, or a combination thereof. For example, the plasma-involved deposition process may be a PECVD process or another applicable process.

Figure 2C:
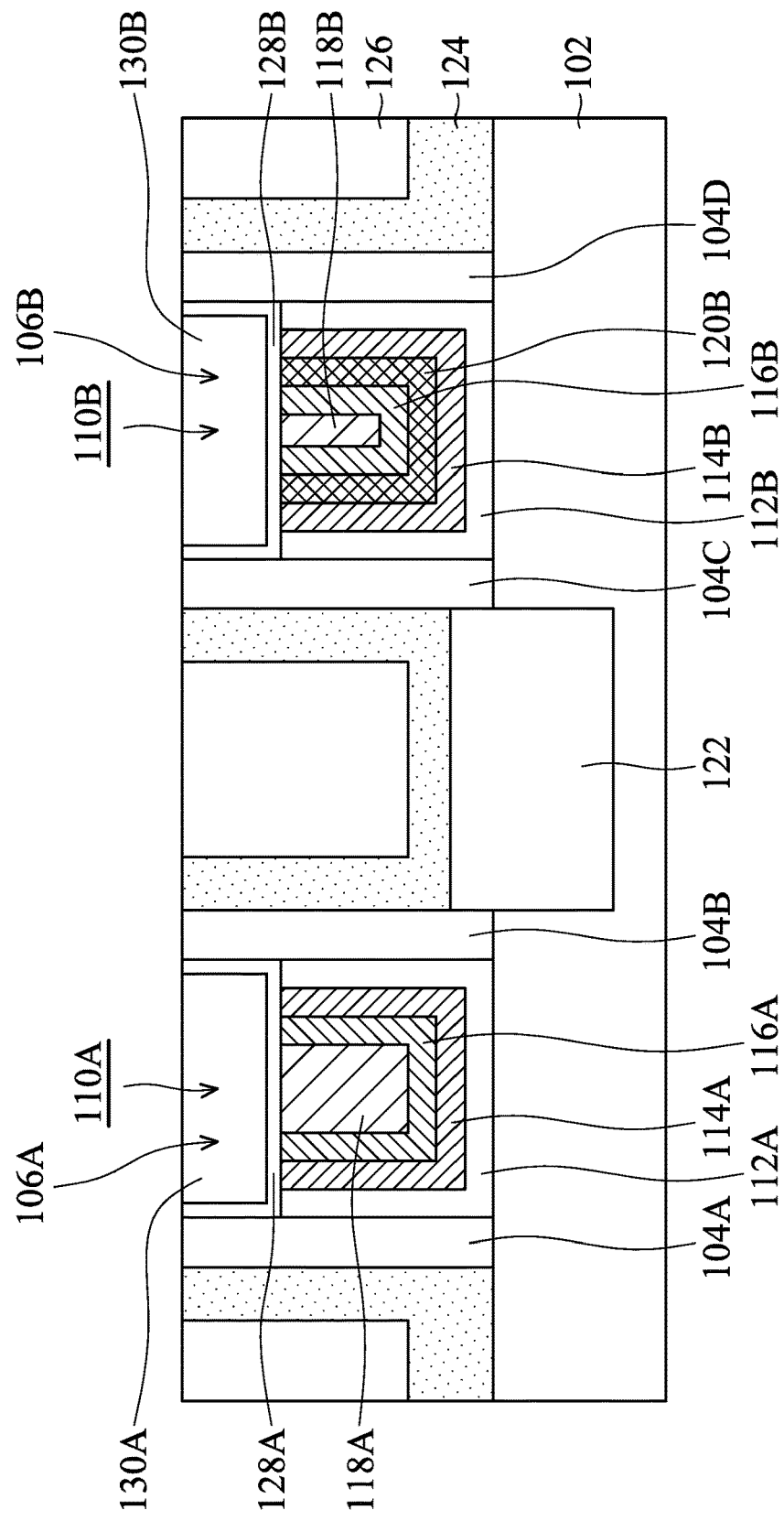

As shown in FIG. 2C, the protection material layers 128 and 130 outside the recesses 110A and 110B are removed, in accordance with some embodiments. In some embodiments, the protection material layers 128 and 130 are partially removed until the spacer elements 104A, 104B, 104C and 104D, the etch stop layer 124 and the dielectric layer 126 are exposed. In some embodiments, a planarization process is performed to remove the protection material layers 128 and 130 outside the recesses 110A and 110B. The planarization process may include a CMP process, a grinding process, an etching process, another applicable process, or a combination thereof.

As shown in FIG. 2C, the remaining portions of the protection material layers 128 and 130 in the recess 110A respectively form protection layers 128A and 130A, in accordance with some embodiments. In some embodiments, the protection layer 128A covers the sidewalls of the spacer elements 104A and 104B. In some embodiments, the protection layer 128A is in direct contact with the sidewalls of the spacer elements 104A and 104B. In some embodiments, the protection layer 128A covers the gate dielectric layer 112A, the work function layers 114A and 116A, and the gate electrode layer 118A of the gate structure 106A.

In some embodiments, the protection layer 130A is over the protection layer 128A in the recess 110A. In some embodiments, a part of the protection layer 128A is sandwiched between the protection layer 130A and the spacer element 104A or 104B. In some embodiments, the protection layer 130A is separated from the spacer elements 104A and 104B without being in direct contact with the sidewalls of the spacer elements 104A and 104B.

As shown in FIG. 2C, the remaining portions of the protection material layers 128 and 130 in the recess 110B respectively form protection layers 128B and 130B, in accordance with some embodiments. In some embodiments, the protection layer 128B covers the sidewalls of the spacer elements 104C and 104D. In some embodiments, the protection layer 128B is in direct contact with the sidewalls of the spacer elements 104C and 104D. In some embodiments, the protection layer 128B covers the gate dielectric layer 112B, the work function layers 114B, 116B and 120B and the gate electrode layer 118B of the gate structure 106B.

In some embodiments, the protection layer 130B is over the protection layer 128B in the recess 110B. In some embodiments, a part of the protection layer 128B is sandwiched between the protection layer 130B and the spacer element 104C or 104D. In some embodiments, the protection layer 130B is separated from the spacer elements 104C and 104D without being in direct contact with the sidewalls of the spacer elements 104C and 104D.

In some embodiments, the protection layers 128A, 128B, 130A and 130B are made of substantially the same material. However, embodiments of the disclosure are not limited thereto. In some other embodiments, the material of the protection layers 128A and 128B is different from that of the protection layers 130A and 130B.

Figure 2D:
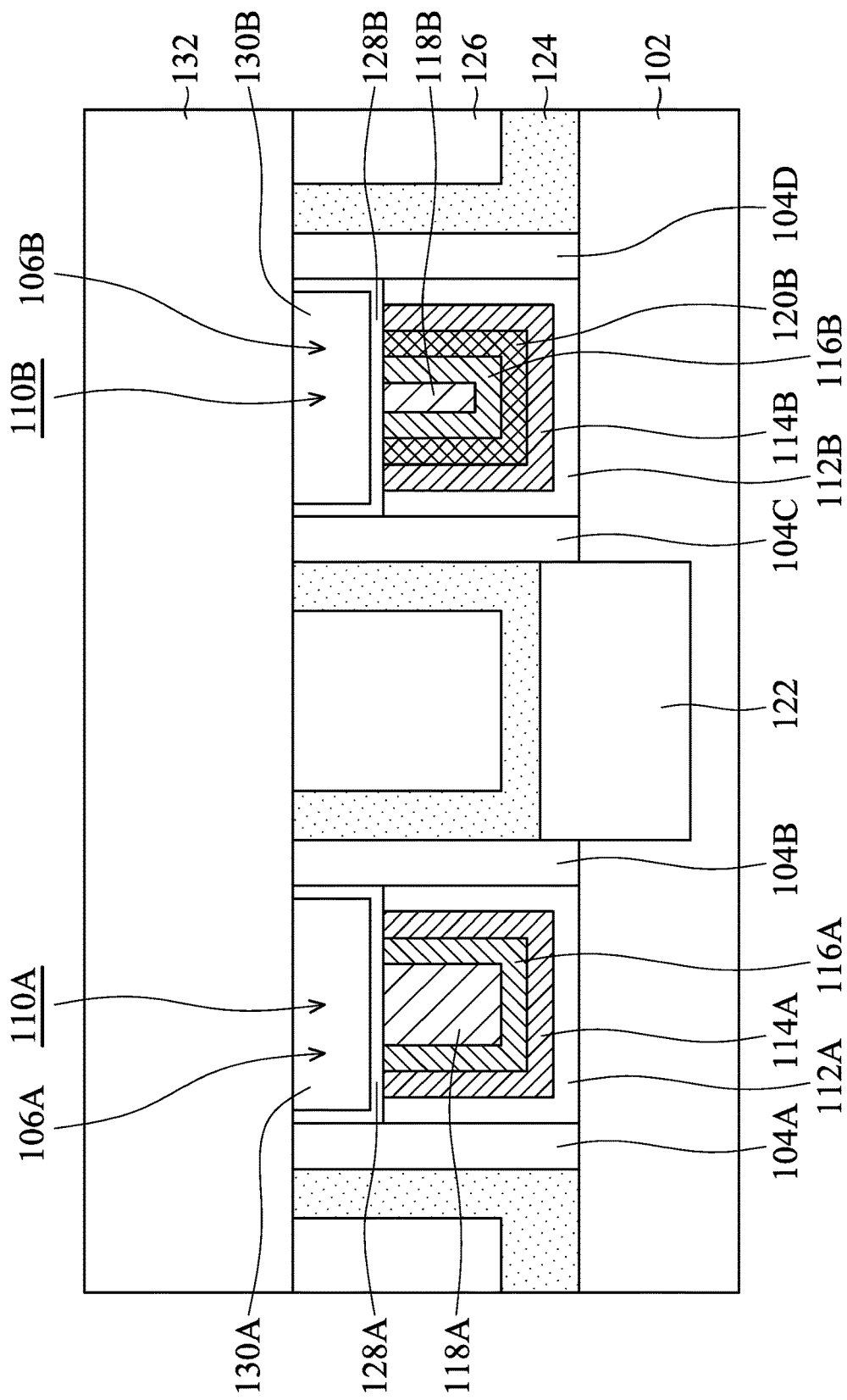

As shown in FIG. 2D, the ILD layer 132 is deposited over the spacer elements 104A, 104B, 104C and 104D, the etch stop layer 124, the dielectric layer 126 and the protection layers 128A, 128B, 130A and 130B, in accordance with some embodiments.

Figure 2E:
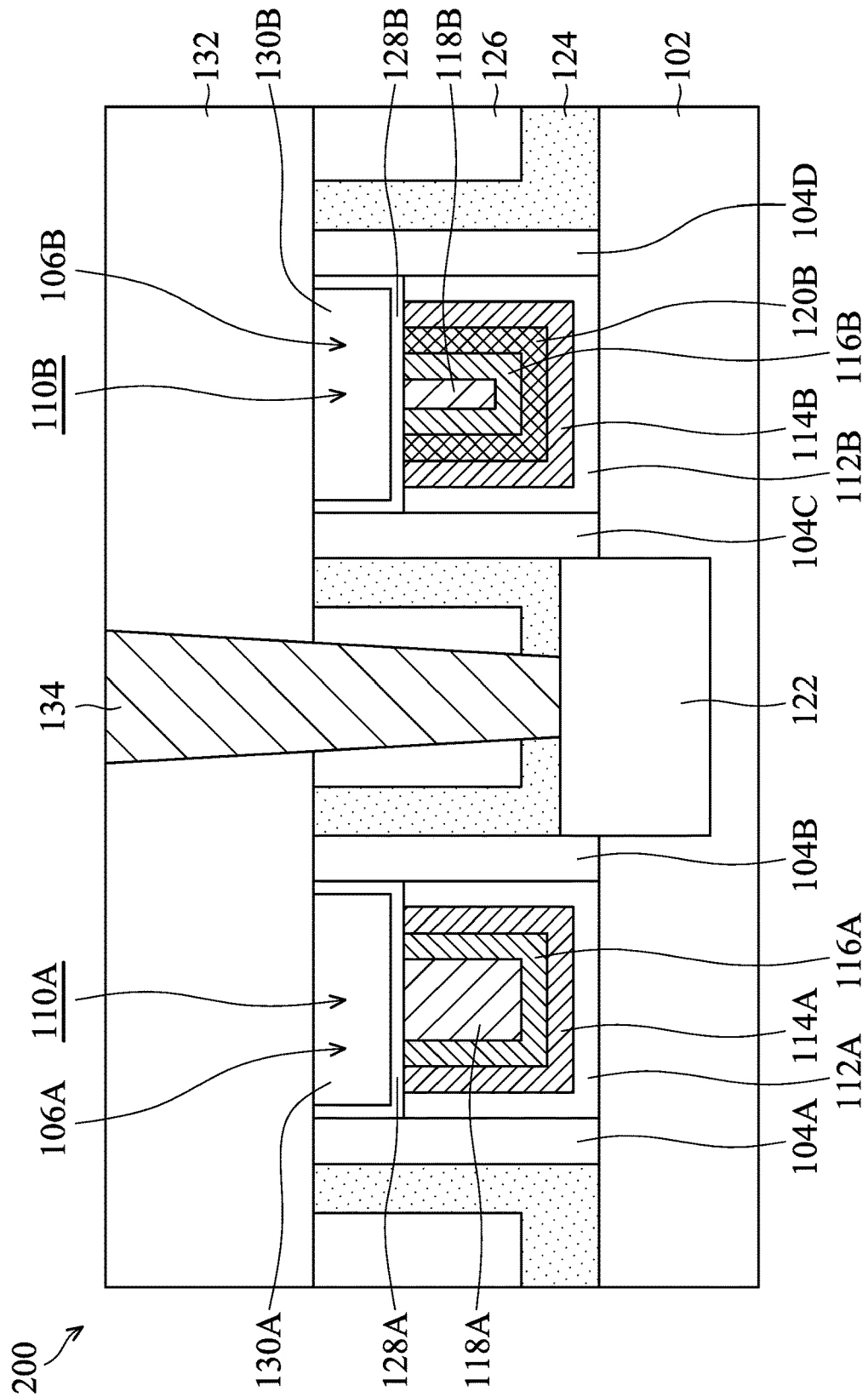

As shown in FIG. 2E, the contact plug 134 is formed in the ILD layer 132, in accordance with some embodiments. As a result, a semiconductor device structure 200 is formed.

Figure 3A:
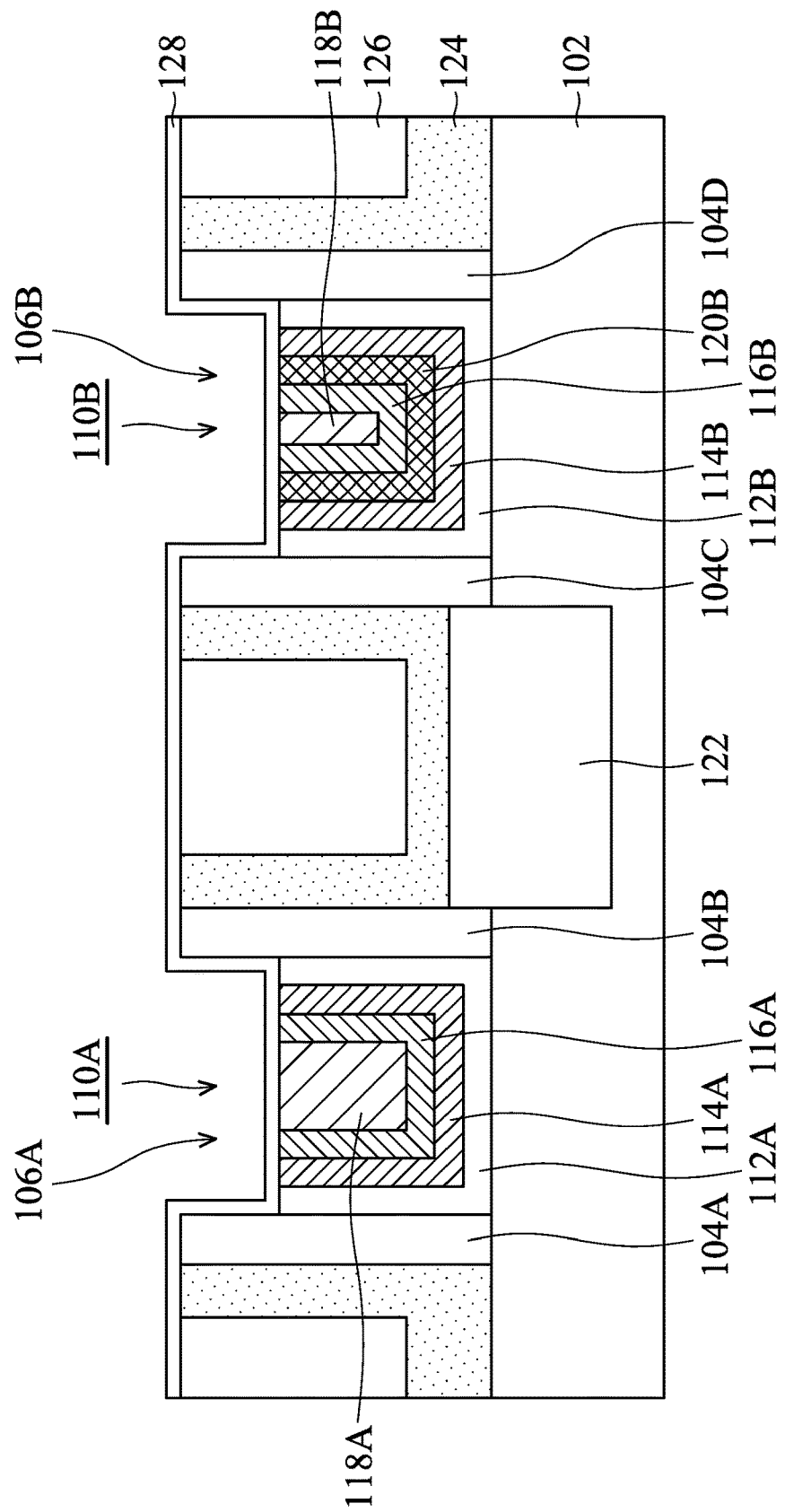
FIGS. 3A-3F are cross-sectional views of various stages of a process for forming a semiconductor device structure, in accordance with some embodiments.

FIGS. 3A-3F are cross-sectional views of various stages of a process for forming a semiconductor device structure, in accordance with some embodiments. As shown in FIG. 3A, a protection material layer 128 is deposited over the spacer elements 104A, 104B, 104C and 104D, the etch stop layer 124 and the dielectric layer 126, in accordance with some embodiments. In some embodiments, various processes similar to those shown in FIG. 2A are performed to form the protection material layer 128. In some embodiments, the protection material layer 128 is deposited using a substantial non-plasma deposition process.

In some embodiments, the protection material layer 128 is further deposited over the top surface of the gate structure 106A in the recess 110A and the sidewalls of the spacer elements 104A and 104B in the recess 110A. In some embodiments, the protection material layer 128 is further deposited over the top surface of the gate structure 106B in the recess 110B and the sidewalls of the spacer elements 104C and 104D in the recess 110B.

In some embodiments, the protection material layer 128 is deposited substantially conformally. In some embodiments, the protection material layer 128 is deposited using a substantial non-plasma deposition process.

Figure 3B:
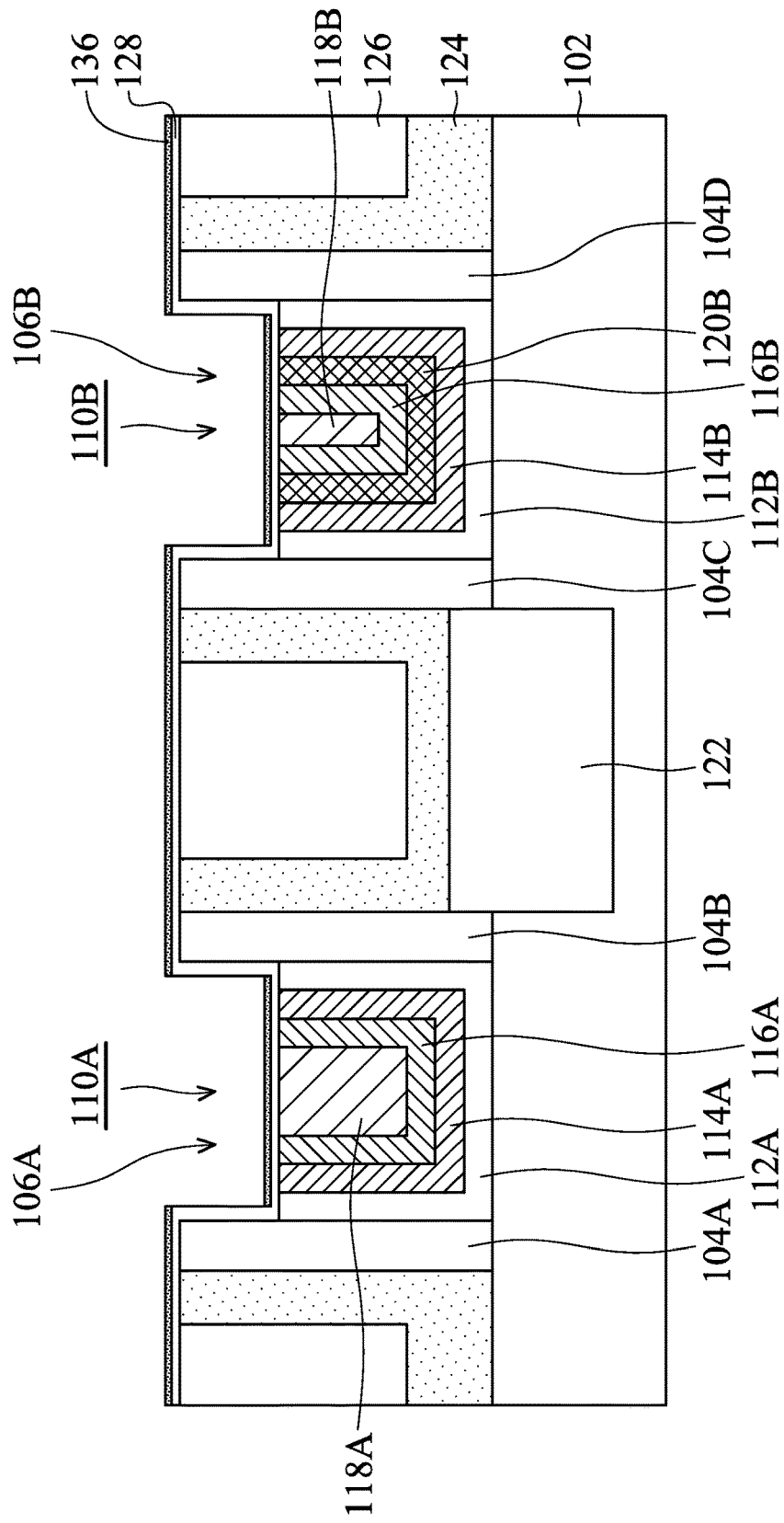

As shown in FIG. 3B, a protection material layer 136 is formed in a surface portion of the protection material layer 128, in accordance with some embodiments. In some embodiments, the protection material layer 136 is formed in the surface portion of the protection material layer 128, which is outside the recesses 110A and 110B. In some embodiments, the protection material layer 136 is formed in the surface portion of the protection material layer 128, which is over the gate structure 106A in the recess 110A and the gate structure 106B in the recess 110B.

In accordance with some embodiments, a surface treatment is used to form the protection material layer 136. In some embodiments, the surface portion of the protection material layer 128 is treated with plasma to form the protection material layer 136 at the top surface of the protection material layer 128. As a result, the surface portion of the protection material layer 128 becomes compact and denser, and then is transferred to the protection material layer 136.

The surface treatment may be used to reduce the etching rate of the surface portion of the protection material layer 128. In some embodiments, the protection material layer 136 has a greater etch resistivity than the protection material layer 128. In some embodiments, the protection material layer 136 has an etching rate less than that of the protection material layer 128. The protection material layer 136 is etched much slower than the protection material layer 128.

In some embodiments, the surface treatment includes a plasma process, another applicable process, or a combination thereof. The plasma process may include a plasma bombardment treatment, a densification plasma treatment, or another plasma-involved treatment.

In some embodiments, the surface treatment is performed at an atmosphere containing an inert gas, such as argon (Ar)

or another suitable gas. In some embodiments, the surface portion or top portion of the protection material layer 128 is treated with an argon-containing plasma or another suitable plasma.

Figure 3C:
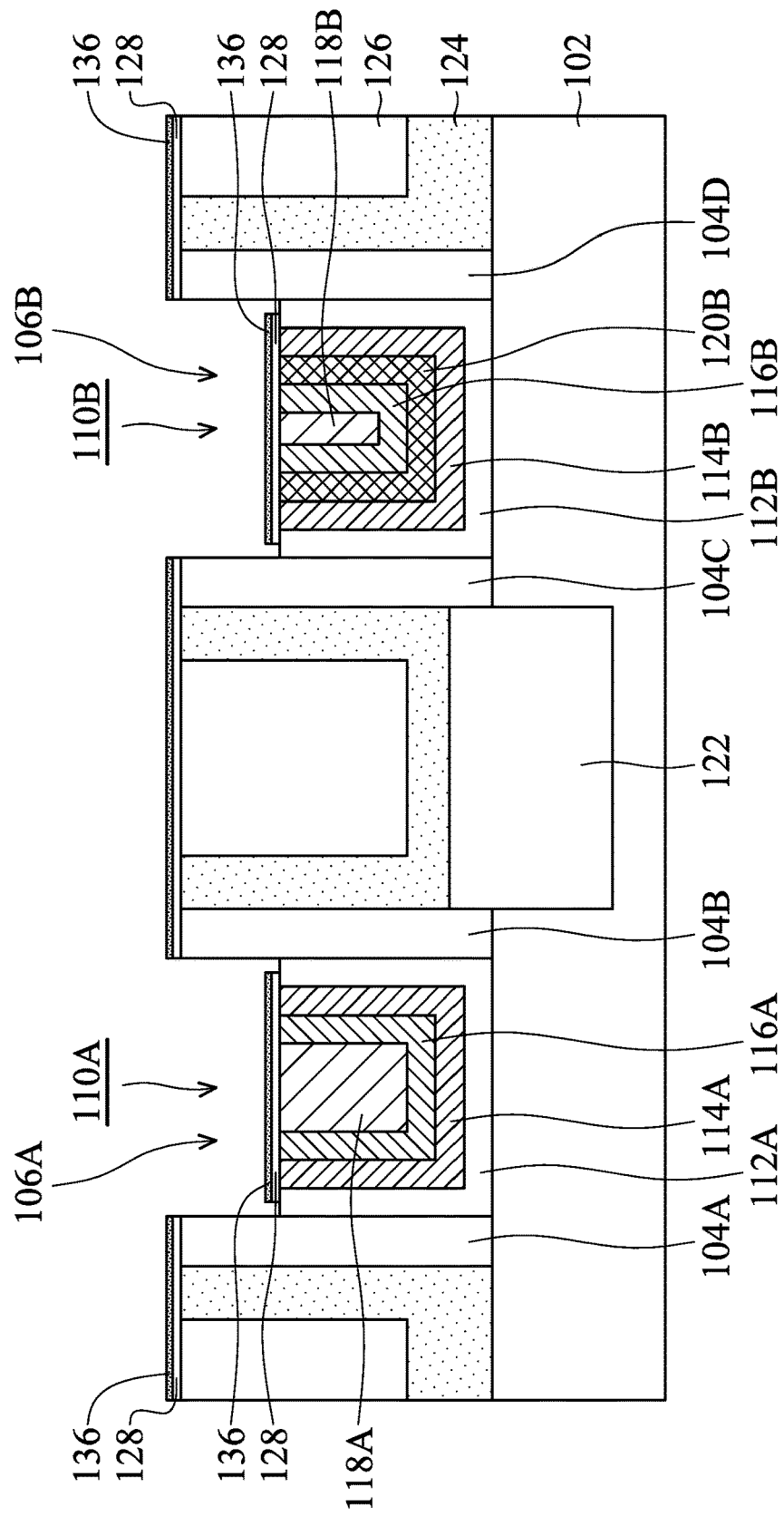

A portion of the protection material layer 128, which covers the sidewalls of the spacer elements 104A, 104B, 104C and 104D in the recesses 110A and 110B, is removed, as shown in FIG. 3C in accordance with some embodiments. In some embodiments, the protection material layer 128 is partially removed using an etching process, another applicable process, or a combination thereof. In some embodiments, the etching process includes a wet etching process or another applicable process. In some embodiments, a portion of the protection material layer 128, which is protected and covered by the protection material layer 136, remains over the gate structures 106A and 106B after the etching process, as shown in FIG. 3C.

Figure 3D:
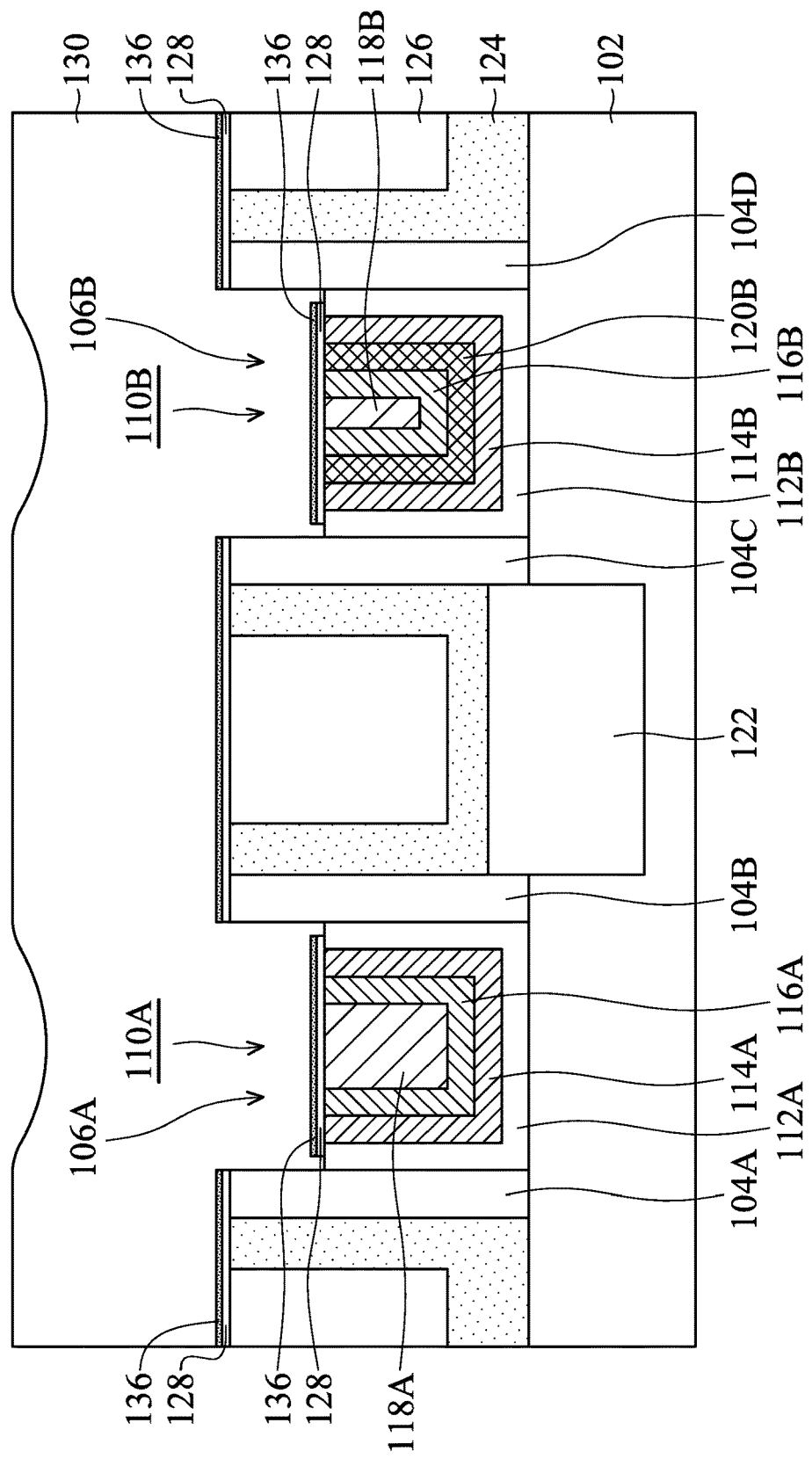

As shown in FIG. 3D, a protection material layer 130 is deposited over the protection material layers 128 and 136, in accordance with some embodiments. In some embodiments, the protection material layer 130 fills up the recesses 110A and 110B. In some embodiments, the protection material layer 130 is deposited using a plasma-involved deposition process, another applicable process, or a combination thereof.

Figure 3E:
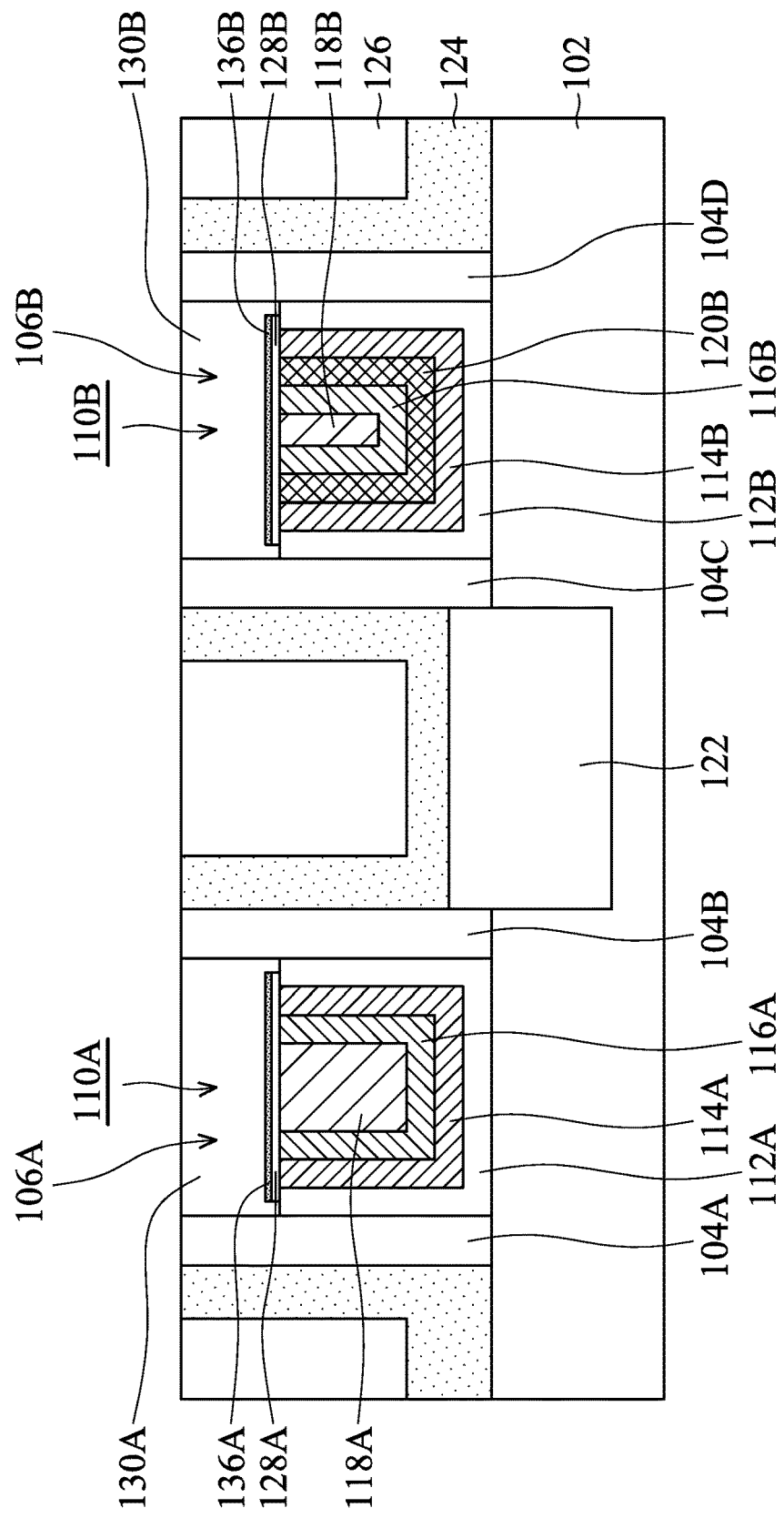

As shown in FIG. 3E, the protection material layers 128, 130 and 136 outside the recesses 110A and 110B are removed, in accordance with some embodiments. In some embodiments, the protection material layers 128, 130 and 136 are partially removed until the spacer elements 104A, 104B, 104C and 104D, the etch stop layer 124 and the dielectric layer 126 are exposed. In some embodiments, a planarization process is performed to remove the protection material layers 128, 130 and 136 outside the recesses 110A and 110B. The planarization process may include a CMP process, a grinding process, an etching process, another applicable process, or a combination thereof.

As shown in FIG. 3E, the remaining portions of the protection material layers 128, 130 and 136 in the recess 110A respectively form protection layers 128A, 130A and 136A, in accordance with some embodiments. In some embodiments, the protection layer 136A is sandwiched between the protection layers 128A and 130A. In some embodiments, the protection layers 128A and 136A are spaced apart from the sidewalls of the spacer elements 104A and 104B. In some embodiments, the protection layer 130A is in direct contact with the sidewalls of the spacer elements 104A and 104B.

In some embodiments, the protection layers 128A and 136A cover the gate dielectric layer 112A, the work function layers 114A and 116A and the gate electrode layer 118A of the gate structure 106A. In some embodiments, the protection layers 128A and 136A partially cover the gate dielectric layer 112A.

As shown in FIG. 3E, the remaining portions of the protection material layers 128, 130 and 136 in the recess 110B respectively form protection layers 128B, 130B and 136B, in accordance with some embodiments. In some embodiments, the protection layer 136B is sandwiched between the protection layers 128B and 130B. In some embodiments, the protection layers 128B and 136B are spaced apart from the sidewalls of the spacer elements 104C and 104D. In some embodiments, the protection layer 130B is in direct contact with the sidewalls of the spacer elements 104C and 104D.

In some embodiments, the protection layers 128B and 136B cover the gate dielectric layer 112B, the work function layers 114B, 116B and 120B and the gate electrode layer 118B of the gate structure 106B. In some embodiments, the protection layers 128B and 136B partially cover the gate dielectric layer 112B.

In accordance with some embodiments, the protection layers 136A and 136B with a greater etch resistivity respectively cover the gate structures 106A and 106B. Accordingly, the protection layers 136A and 136B over the protection layers 128A and 128B provide further prevention of the gate structures 106A and 106B from being electrically connected to a shifted contact plug.

Figure 3F:
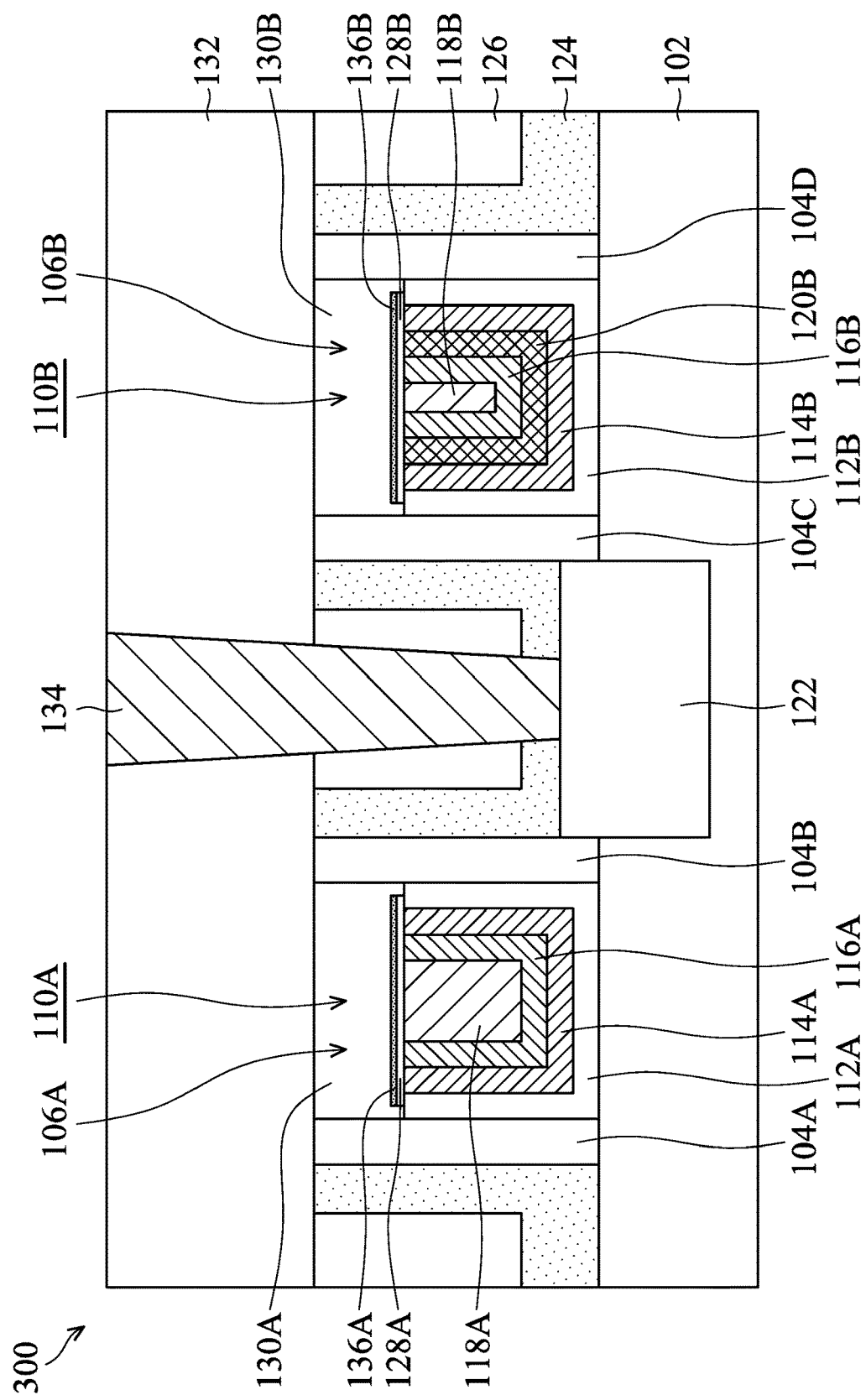

Afterwards, multiple processes similar to those shown in FIGS. 2D and 2E are performed. As shown in FIG. 3F, the ILD layer 132 is deposited over the spacer elements 104A, 104B, 104C and 104D, the etch stop layer 124, the dielectric layer 126 and the protection layers 128A, 128B, 130A, 130B, 136A and 136B, in accordance with some embodiments. The contact plug 134 is then formed in the ILD layer 132. As a result, a semiconductor device structure 300 is formed.

Figure 4A:
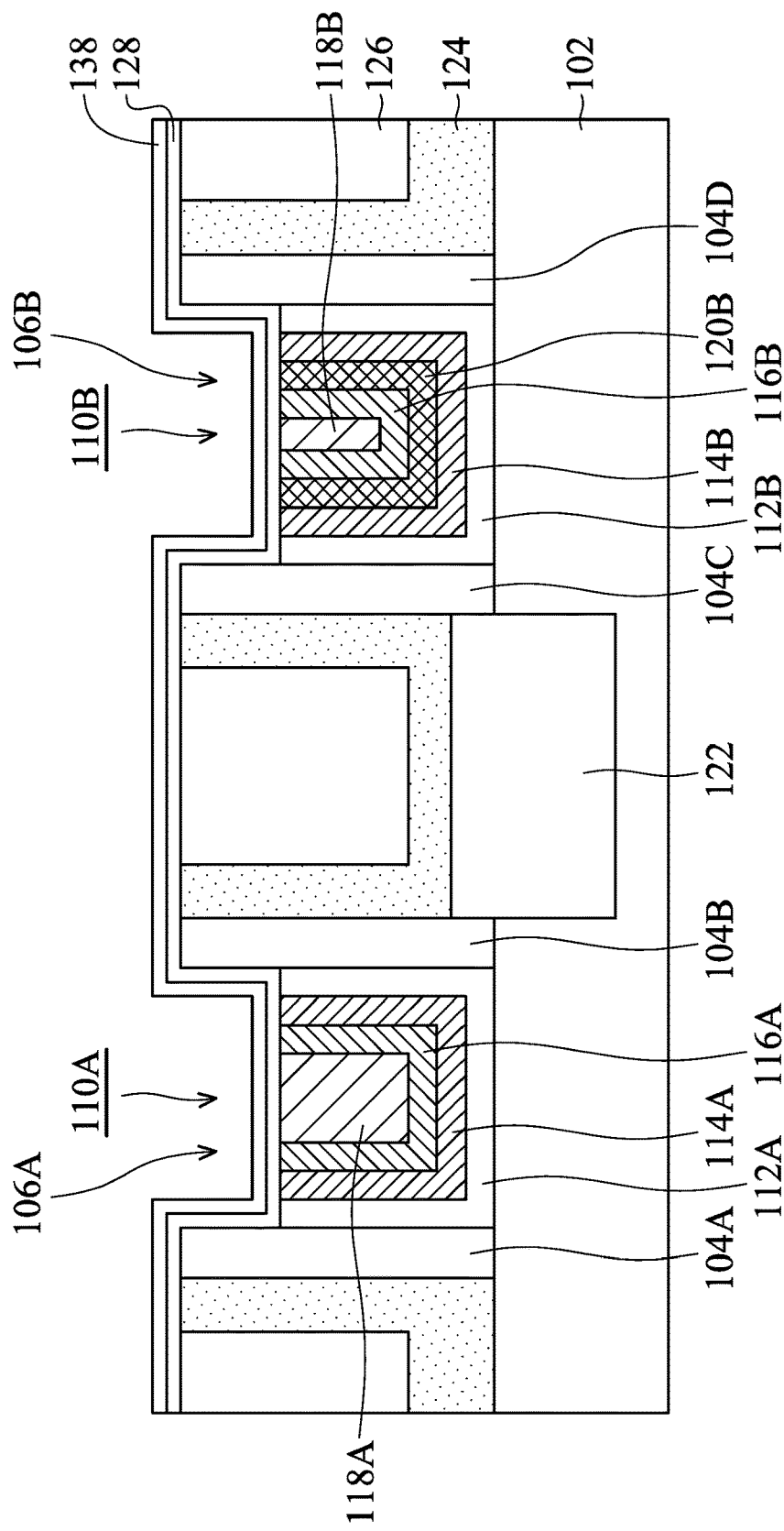
FIGS. 4A and 4B are cross-sectional views of various stages of a process for forming a semiconductor device structure, in accordance with some embodiments.
Figure 4B:
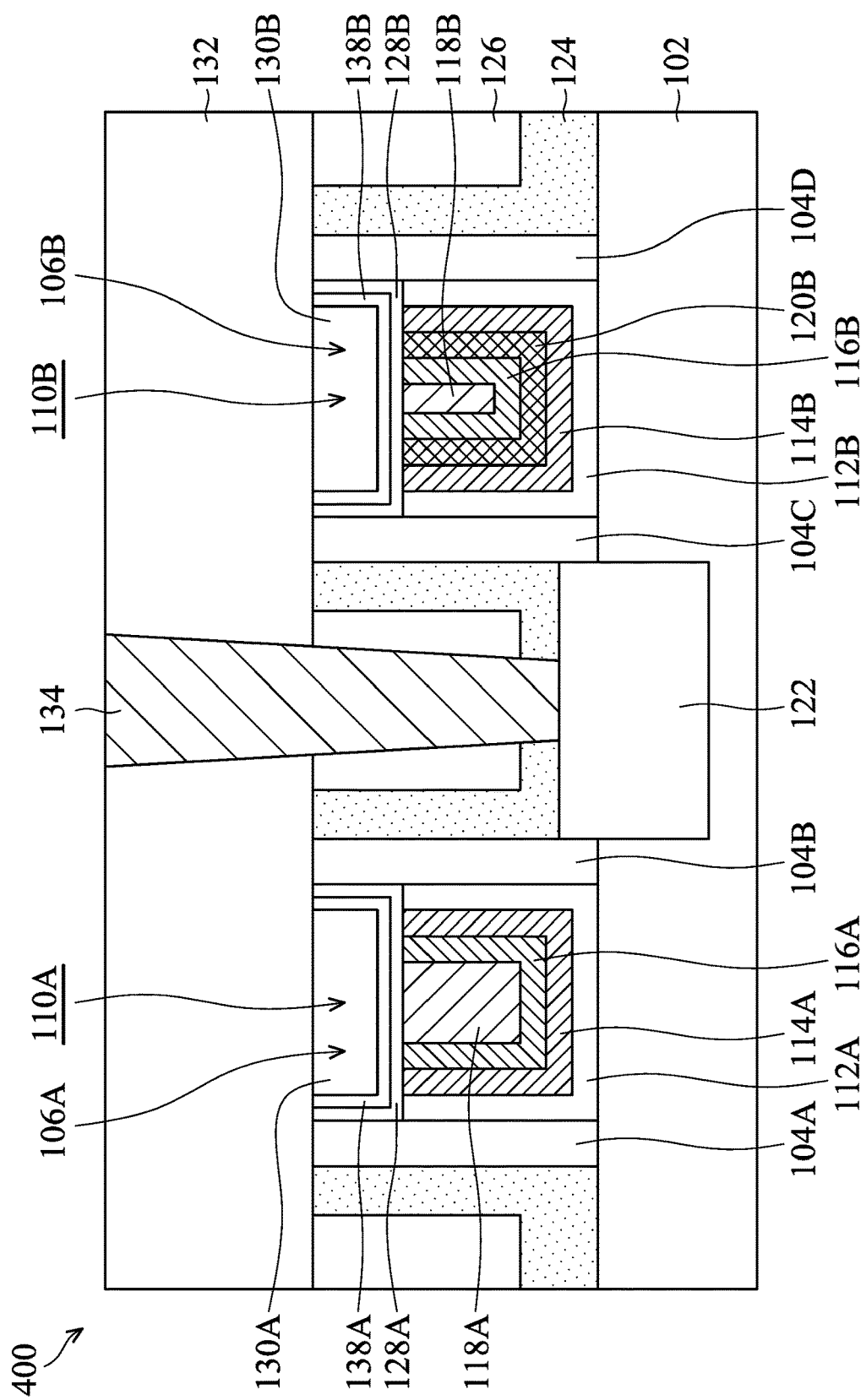

FIGS. 4A and 4B are cross-sectional views of various stages of a process for forming a semiconductor device structure, in accordance with some embodiments. As shown in FIG. 4A, a protection material layer 138 is deposited over the protection material layer 128, in accordance with some embodiments. In some embodiments, the protection material layer 138 fills the recesses 110A and 110B. In some embodiments, the protection material layer 138 is deposited substantially conformally.

In some embodiments, the protection material layer 138 includes a dielectric material. In some embodiments, the dielectric material includes silicon oxide, silicon oxycarbide, silicon nitride, nitrogen silicon carbide, another suitable material, or a combination thereof.

In accordance with some embodiments, the deposition of the protection material layer 138 includes a non-plasma process. In some embodiments, the protection material layer 128 is deposited using a non-plasma process. For example, the substantial non-plasma deposition process may be a non-plasma CVD process, a non-plasma ALD process, a non-plasma thermal deposition process, another applicable process, or a combination thereof.

In some embodiments, the substantial non-plasma CVD process includes a LPCVD process, a LTCVD process, a RTCVD process, another applicable process, or a combination thereof. In some embodiments, the substantial non-plasma thermal deposition process includes introducing a gaseous precursor for forming the protection material layer 138 to the protection material layer 128. Afterwards, the gaseous precursor reacts by performing a thermal treatment. As a result, the protection material layer 138 is deposited over the protection material layer 128, as shown in FIG. 4A.

As shown in FIG. 4B, various processes similar to those shown in FIGS. 2B-2E are performed to form a semiconductor device structure 400, in accordance with some embodiments. In some embodiments, the remaining portions of the protection material layer 138 in the recesses 110A and 110B respectively form protection layers 138A and 138B.

In some embodiments, the protection layer 128A is in direct contact with the sidewalls of the spacer elements 104A and 104B. In some embodiments, the protection layers 130A and 138A are separated from the spacer elements 104A and 104B without being in direct contact with the sidewalls of the spacer elements 104A and 104B. In some embodiments, the protection layer 128A covers the gate dielectric layer 112A, the work function layers 114A and 116A, and the gate electrode layer 118A of the gate structure

106A. In some embodiments, the protection layers 130A and 138A partially cover the gate dielectric layer 112A.

In some embodiments, the protection layer 128B is in direct contact with the sidewalls of the spacer elements 104C and 104D. In some embodiments, the protection layers 130B and 138B are separated from the spacer elements 104C and 104D without being in direct contact with the sidewalls of the spacer elements 104C and 104D. In some embodiments, the protection layer 128B covers the gate dielectric layer 112B, the work function layers 114B, 116B and 120B and the gate electrode layer 118B of the gate structure 106B. In some embodiments, the protection layers 130B and 138B partially cover the gate dielectric layer 112B.

Figure 5A:
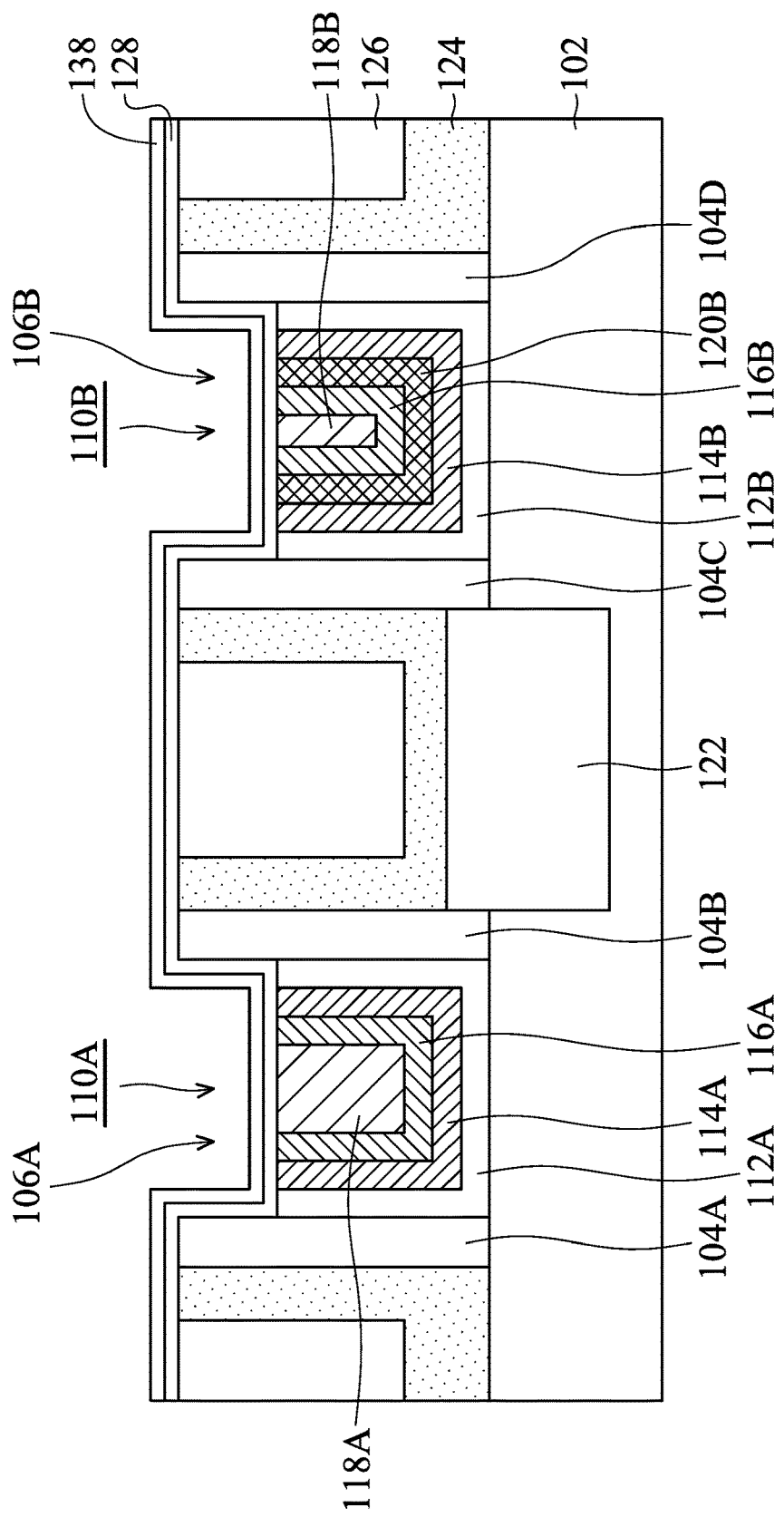
FIGS. 5A-5D are cross-sectional views of various stages of a process for forming a semiconductor device structure, in accordance with some embodiments.

FIGS. 5A-5D are cross-sectional views of various stages of a process for forming a semiconductor device structure, in accordance with some embodiments. Similar to that shown in FIG. 4A, the protection material layers 128 and 138 are sequentially deposited, as shown in FIG. 5A in accordance with some embodiments. In some embodiments, the protection material layers 128 and 138 are separately deposited using a non-plasma process.

Figure 5B:
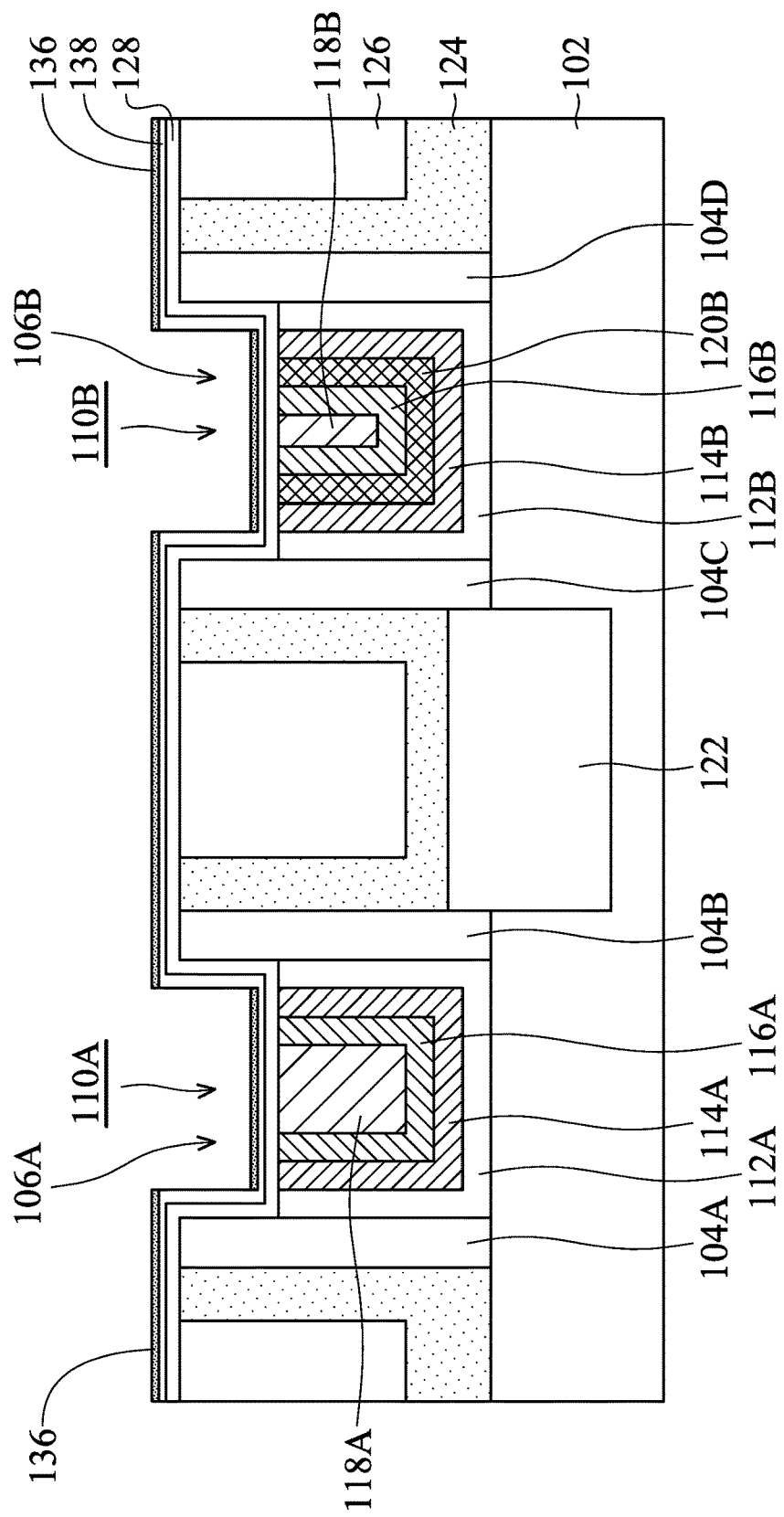

Afterwards, similar to that shown in FIG. 3B, the protection material layer 136 is formed in the surface portion of the protection material layer 128, as shown in FIG. 5B in accordance with some embodiments. In some embodiments, the protection material layer 136 is formed using a surface treatment that is similar to or the same as that shown in FIG. 3B.

In some embodiments, the protection material layer 136 is formed in the surface portion of the protection material layer 138, which is outside the recesses 110A and 110B. In some embodiments, the protection material layer 136 is formed in the surface portion of the protection material layer 138, which is over the gate structure 106A in the recess 110A and the gate structure 106B in the recess 110B.

Figure 5C:
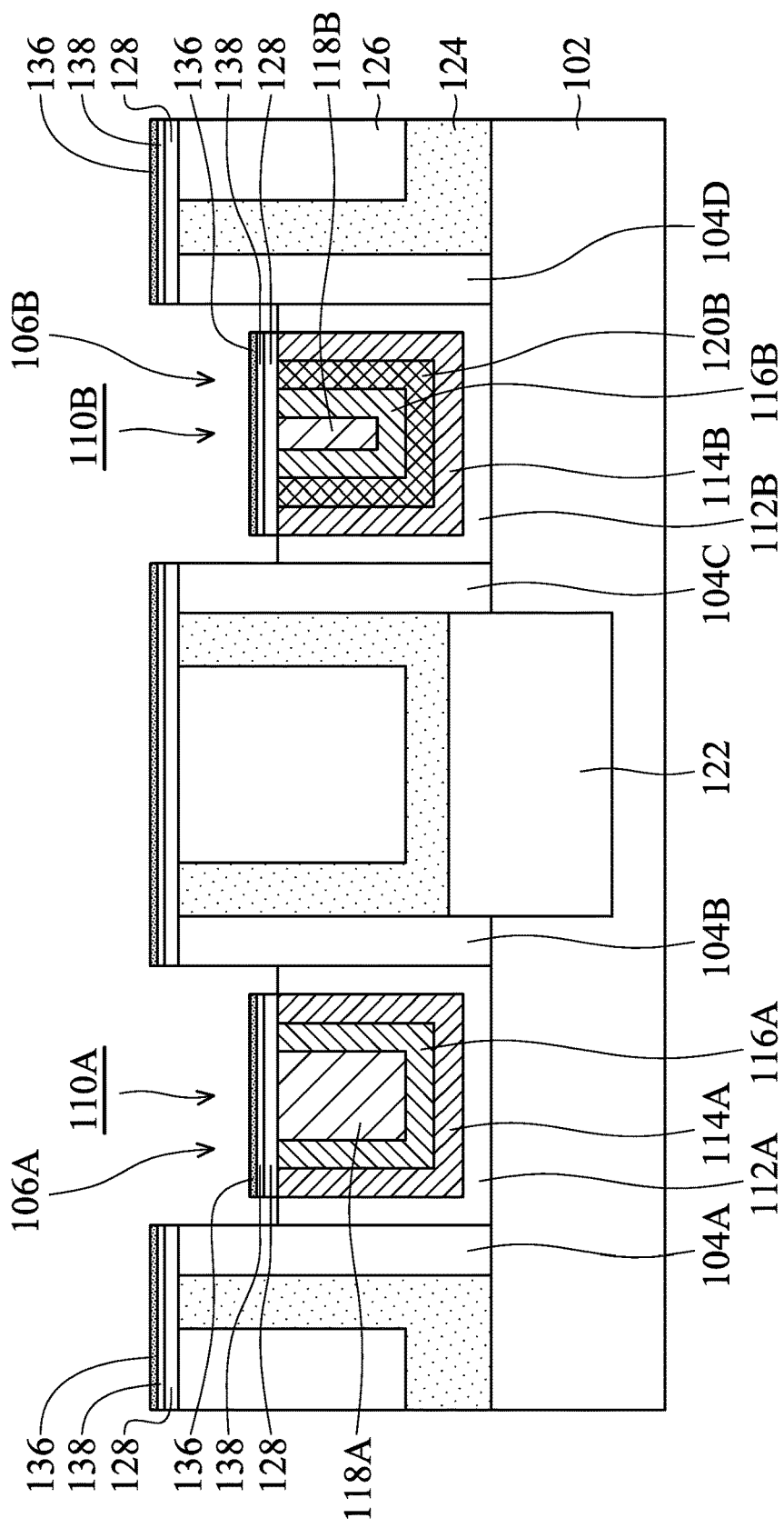

A portion of the protection material layer 138, which covers the sidewalls of the spacer elements 104A, 104B, 104C and 104D in the recesses 110A and 110B, is removed, as shown in FIG. 5C in accordance with some embodiments. In some embodiments, the protection material layer 138 is partially removed using an etching process, another applicable process, or a combination thereof. In some embodiments, the etching process includes a wet etching process or another applicable process.

Figure 5D:
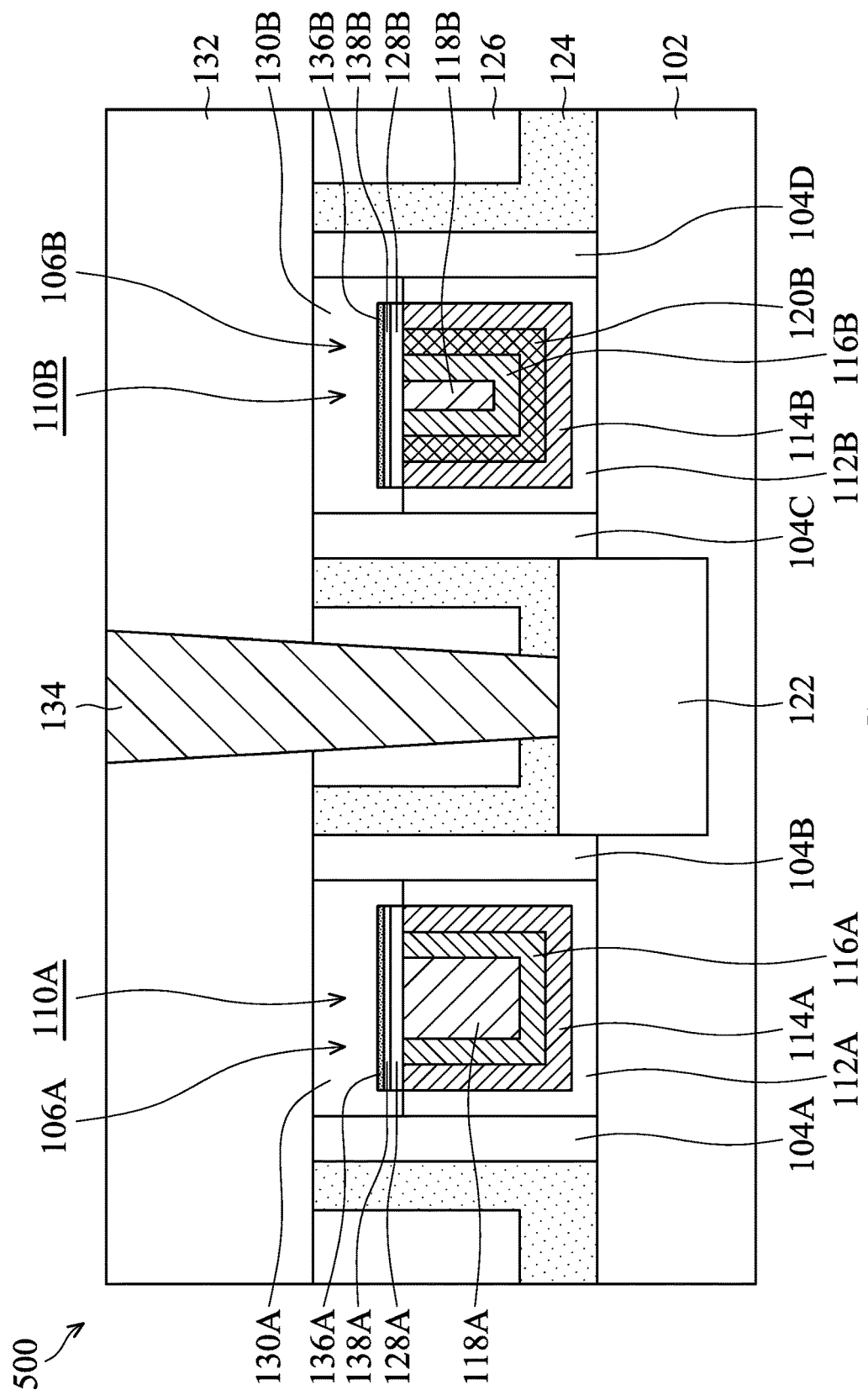

As shown in FIG. 5D, various processes similar to those shown in FIGS. 3D-3F are performed to form a semiconductor device structure 500, in accordance with some embodiments. In some embodiments, the remaining portions of the protection material layer 136 in the recesses 110A and 110B respectively form protection layers 136A and 136B.

As shown in FIG. 5D, the protection layer 136A is sandwiched between the protection layers 138A and 130A, in accordance with some embodiments. In some embodiments, the protection layer 136B is sandwiched between the protection layers 138B and 130B.

As shown in FIG. 5D, in some embodiments, the protection layer 130A is in direct contact with the sidewalls of the spacer elements 104A and 104B. In some embodiments, the protection layers 128A, 136A and 138A are separated from the spacer elements 104A and 104B without being in direct contact with the sidewalls of the spacer elements 104A and 104B.

As shown in FIG. 5D, in some embodiments, the protection layer 130B is in direct contact with the sidewalls of the spacer elements 104C and 104D. In some embodiments, the protection layers 128B, 136B and 138B are separated from the spacer elements 104C and 104D without being in direct contact with the sidewalls of the spacer elements 104C and 104D.

As shown in FIG. 5D, in some embodiments, the protection layers 128A, 136A and 138A cover the gate dielectric layer 112A, the work function layers 114A and 116A, and the gate electrode layer 118A of the gate structure 106A. In some embodiments, the protection layers 128B, 136B and 138B cover the gate dielectric layer 112B, the work function layers 114B, 116B and 120B and the gate electrode layer 118B of the gate structure 106B.

Embodiments of the disclosure form a semiconductor device structure with a gate structure. A protection layer is formed or deposited using a substantial non-plasma process to cover the gate structure. The gate structure is not exposed to plasma during the formation or deposition of the protection layer. Due to the protection layer, the gate structure is prevented from being in direct contact with plasma during subsequent plasma-involved processes. As a result, current leakage via the gate structure, which may be the result of plasma-induced damage to the gate structure, is reduced or eliminated. Accordingly, the breakdown voltage of the semiconductor device structure is improved. Therefore, the performance and reliability of the semiconductor device structure is greatly enhanced.

Embodiments of the disclosure can be applied to not only a semiconductor device structure with planar FETs but also a semiconductor device structure with FinFETs. Furthermore, embodiments of the disclosure are not limited and may be applied to fabrication processes for any suitable technology generation. Various technology generations include a 20 nm node, a 16 nm node, a 10 nm node, or another suitable node.

In accordance with some embodiments, a method for forming a semiconductor device structure is provided. The method includes forming a gate structure over a semiconductor substrate. The method also includes forming spacer elements adjoining sidewalls of the gate structure. The method further includes forming a protection material layer over the gate structure. The formation of the protection material layer includes a substantial non-plasma process. In addition, the method includes depositing a dielectric material layer over the protection material layer. The deposition of the dielectric material layer includes a plasma-involved process.

In accordance with some embodiments, a method for forming a semiconductor device structure is provided. The method includes forming spacer elements over a semiconductor substrate. An opening is provided between the spacer elements. The method also includes forming a gate structure in the opening. The method further includes forming a protection material layer over the gate structure in the opening. In addition, the method includes depositing a dielectric material layer over the protection material layer to fill up the opening. The deposition of the dielectric material layer includes a plasma process. The protection material layer isolates the gate structure from plasma during the plasma process.

In accordance with some embodiments, a semiconductor device structure is provided. The semiconductor device structure includes a gate structure over a semiconductor substrate. The gate structure includes a gate dielectric layer and a gate electrode layer over the gate dielectric layer. The semiconductor device structure also includes spacer elements adjoining sidewalls of the gate structure and protruding from a top surface of the gate electrode layer. The semiconductor device structure further includes a protection layer over the gate electrode layer and between the spacer elements. In addition, the semiconductor device structure includes a dielectric layer over the protection layer and between the spacer elements. The gate electrode layer is separated from the dielectric layer by the protection layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a gate structure over a semiconductor substrate;
    forming spacer elements having sidewalls in contact with sidewalls of the gate structure;
    forming a protection material layer over the gate structure, wherein the formation of the protection material layer comprises a non-plasma process; and
    depositing a dielectric material layer over the protection material layer, wherein the deposition of the dielectric material layer comprises a plasma process, and wherein a portion of the dielectric material layer is between the sidewalls of the spacer elements and sidewalls of the protection material layer.

2. The method for forming a semiconductor device structure as claimed in claim 1, wherein the formation of the protection material layer comprises oxidizing a top surface of the gate structure.

3. The method for forming a semiconductor device structure as claimed in claim 1, wherein the formation of the protection material layer comprises a non-plasma chemical vapor deposition process, a non-plasma atomic layer deposition process, a non-plasma thermal deposition process, or a combination thereof.

4. The method for forming a semiconductor device structure as claimed in claim 1, wherein the plasma process comprises a plasma-enhanced chemical vapor deposition process.

5. The method for forming a semiconductor device structure as claimed in claim 1, wherein the spacer elements and the gate structure together surround a recess over the gate structure, and the protection material layer and the dielectric material layer extend outside the recess and cover the spacer elements, and wherein the method further comprises:
    removing the protection material layer and the dielectric material layer outside the recess until the spacer elements are exposed.

6. The method for forming a semiconductor device structure as claimed in claim 1, further comprising:
    treating a surface of the protection material layer with plasma before the plasma process.

7. The method for forming a semiconductor device structure as claimed in claim 6, further comprising:
    partially etching the protection material layer after the treatment and before the plasma process.

8. A method for forming a semiconductor device structure, comprising:
    forming a gate structure in an opening between two adjacent spacer elements, wherein the gate structure comprises a gate electrode layer and a gate dielectric layer between the two adjacent spacer elements and the gate electrode layer;
    forming a first protection material layer over the gate electrode layer by a non-plasma deposition process, wherein at least a portion of the gate dielectric layer is exposed from the first protection material layer, so that a gap is formed between the first protection material layer and the two adjacent spacer elements; and
    forming a second protection material layer over the first protection material layer by a plasma process to fill up the opening, so that the gap is filled with the second protection material layer.

9. The method for forming a semiconductor device structure as claimed in claim 8, further comprising:
    forming a third protection material layer between the first protection material layer and the second protection material layer.

10. The method for forming a semiconductor device structure as claimed in claim 9, wherein the third protection material layer is formed by treating a surface of the first protection material layer with plasma before the plasma process.

11. The method for forming a semiconductor device structure as claimed in claim 9, wherein the formation of the first protection material layer comprises:
    forming a dielectric material layer over sidewalls of the two adjacent spacer elements and over a top surface of the gate structure; and
    removing the dielectric material layer over the sidewalls of the two adjacent spacer elements after the third protection material layer is formed and before the second protection material layer is formed.

12. The method for forming a semiconductor device structure as claimed in claim 9, wherein the third protection material layer has a greater etch resistivity than the first protection material layer.

13. The method for forming a semiconductor device structure as claimed in claim 8, wherein the gate electrode layer is not exposed to plasma during the plasma process.

14. A method for forming a semiconductor device structure, comprising:
    forming spacer elements over a semiconductor substrate, wherein an opening is provided between the spacer elements;
    forming a gate structure in the opening and in contact with sidewalls of the spacer elements;
    forming a protection material layer over the gate structure in the opening, wherein the formation of the protection material layer comprises a non-plasma process; and
    depositing a dielectric material layer over the protection material layer to fill up the opening, wherein the deposition of the dielectric material layer comprises a plasma process, and the protection material layer isolates the gate structure from plasma during the plasma process, and wherein a portion of the dielectric material layer is between the sidewalls of the spacer elements and sidewalls of the protection material layer.

15. The method for forming a semiconductor device structure as claimed in claim 14, wherein the gate structure comprises a gate dielectric layer and a gate electrode layer, and wherein the protection material layer covers the gate electrode layer and exposes the gate dielectric layer before the deposition of the dielectric material layer.

16. The method for forming a semiconductor device structure as claimed in claim 14, wherein the gate structure comprises a metal material, and the formation of the protection material layer comprises oxidizing the metal material.

17. The method for forming a semiconductor device structure as claimed in claim 14, wherein the protection material layer is substantially conformally deposited over the gate structure in the opening.

18. The method for forming a semiconductor device structure as claimed in claim 14, wherein the gate structure is not exposed to plasma during the formation of the protection material layer.

19. The method for forming a semiconductor device structure as claimed in claim 14, further comprising:
- forming a second protection material layer in the opening to cover the protection material layer before the deposition of the dielectric material layer, wherein the protection material layer and the gate structure are not exposed to plasma during the formation of the second protection material layer.

20. The method for forming a semiconductor device structure as claimed in claim 19, further comprising:
- treating a surface of the second protection material layer with plasma before the deposition of the dielectric material layer; and
- etching the second protection material layer and the protection material layer after the treatment.

* * * * *